US008501874B2

(12) United States Patent
Tanaka et al.

(10) Patent No.: US 8,501,874 B2
(45) Date of Patent: *Aug. 6, 2013

(54) THERMOSETTING RESIN COMPOSITION, MULTILAYER BODY USING SAME, AND CIRCUIT BOARD

(75) Inventors: Shigeru Tanaka, Osaka (JP); Kanji Shimoohsako, Osaka (JP); Takashi Itoh, Shiga (JP); Koji Okada, Osaka (JP); Mutsuaki Murakami, Osaka (JP)

(73) Assignee: Kaneka Corporation, Osaka (JP)

( * ) Notice: Subject to any disclaimer, the term of this patent is extended or adjusted under 35 U.S.C. 154(b) by 942 days.

This patent is subject to a terminal disclaimer.

(21) Appl. No.: 12/188,898

(22) Filed: Aug. 8, 2008

(65) Prior Publication Data

US 2008/0306220 A1 Dec. 11, 2008

Related U.S. Application Data

(63) Continuation of application No. 10/552,540, filed as application No. PCT/JP2004/005227 on Apr. 12, 2004, now Pat. No. 7,521,511.

(30) Foreign Application Priority Data

Apr. 18, 2003 (JP) ................................ 2003-114913
Jul. 30, 2003 (JP) ................................ 2003-204040

(51) Int. Cl.
| | | |
|---|---|---|
| *A47G 19/08* | (2006.01) | |
| *B32B 15/04* | (2006.01) | |
| *B32B 15/08* | (2006.01) | |
| *C07F 9/24* | (2006.01) | |
| *C08F 283/00* | (2006.01) | |
| *C08F 283/04* | (2006.01) | |
| *C08G 18/77* | (2006.01) | |
| *C08G 59/14* | (2006.01) | |
| *C08G 65/32* | (2006.01) | |
| *C08G 65/48* | (2006.01) | |
| *C08G 69/48* | (2006.01) | |
| *C08G 79/02* | (2006.01) | |
| *C08K 5/49* | (2006.01) | |
| *C08K 5/51* | (2006.01) | |
| *C08K 5/5399* | (2006.01) | |
| *C08L 61/00* | (2006.01) | |
| *C08L 61/04* | (2006.01) | |
| *C08L 63/00* | (2006.01) | |
| *C08L 67/00* | (2006.01) | |
| *C08L 71/02* | (2006.01) | |
| *C08L 71/12* | (2006.01) | |
| *C08L 75/04* | (2006.01) | |
| *C08L 77/00* | (2006.01) | |
| *C08L 85/02* | (2006.01) | |

(52) U.S. Cl.
USPC ........ 525/396; 211/41.17; 428/457; 428/458; 428/626; 524/115; 524/116; 524/122; 524/138; 525/395; 525/397; 525/523; 525/534; 525/538; 525/408; 525/420; 525/423; 525/429

(58) Field of Classification Search
USPC ...... 211/41.17; 428/457, 458, 626; 524/115, 524/116, 122, 138; 525/395, 396, 397, 523, 525/534, 538, 408, 420, 423, 429
See application file for complete search history.

(56) References Cited

U.S. PATENT DOCUMENTS

| | | | | |
|---|---|---|---|---|
| 5,639,808 A | | 6/1997 | Coggio et al. | ................ 523/452 |
| 7,521,511 B2 * | | 4/2009 | Tanaka et al. | ................ 525/396 |

FOREIGN PATENT DOCUMENTS

| | | |
|---|---|---|
| JP | 06-264035 | 9/1994 |
| JP | 07-082482 | 3/1995 |
| JP | 2001-200157 | 7/2001 |
| JP | 2001-203467 | 7/2001 |
| JP | 2002-047472 | 2/2002 |
| JP | 2002-060620 | 2/2002 |
| JP | 2002-235001 | 8/2002 |

OTHER PUBLICATIONS

English machine translation of JP 2001-203467 Omori et al., Jul. 2001.*

* cited by examiner

*Primary Examiner* — Patrick Niland
(74) *Attorney, Agent, or Firm* — Westerman, Hattori, Daniels & Adrian, LLP

(57) ABSTRACT

The present invention relates to thermosetting resin compositions which are suitably used for manufacturing circuit boards, such as flexible printed circuit boards (FPCs) and build-up circuit boards, and to multilayer bodies and circuit boards manufactured using such thermosetting resin compositions.

A thermosetting resin composition contains a polyimide resin component (A), a phenol resin component (B), and an epoxy resin component (C). The mixing ratio by weight (A)/[(B)+(C)] is in a range of 0.4 to 2.0, the mixing ratio by weight being the ratio of the weight of the component (A) to the total weight of the component (B) and the component (C). By using such a thermosetting resin composition, it is possible to manufacture multilayer bodies and circuit boards which are excellent in dielectric characteristics, adhesiveness, processability, heat resistance, flowability, etc.

A thermosetting resin composition contains a polyimide resin (A), a phosphazene compound (D), and a cyanate ester compound (E). The phosphazene compound (D) includes a phenolic hydroxyl group-containing phenoxyphosphazene compound (D-1) and/or a crosslinked phenoxyphosphazene compound (D-2) prepared by crosslinking the phenoxyphosphazene compound (D-1), the crosslinked phenoxyphosphazene compound (D-2) having at least one phenolic hydroxyl group. By using such a thermosetting resin composition, it is possible to manufacture multilayer bodies and circuit boards which are excellent in dielectric characteristics, processability, heat resistance, and flame retardance.

17 Claims, No Drawings

THERMOSETTING RESIN COMPOSITION, MULTILAYER BODY USING SAME, AND CIRCUIT BOARD

CROSS-REFERENCE TO THE RELATED APPLICATIONS

This application is a continuation of application Ser. No. 10/552,540 filed Oct. 11, 2005, which is national stage of international application No. PCT/JP2004/005227 filed Apr. 12, 2004, the entire contents of which are incorporated herein by reference. This application also claims benefit of priority under 35 USC 119 to Japanese Patent Application No. 2003-114913 filed Apr. 18, 2003 and Japanese Patent Application No. 2003-204040 filed Jul. 30, 2003, the entire contents of both applications are incorporated herein by reference.

TECHNICAL FIELD

The present invention relates to thermosetting resin compositions which are suitably used for manufacturing circuit boards, such as flexible printed circuit boards (FPCs) and build-up circuit boards, and to multilayer bodies and circuit boards manufactured using such thermosetting resin compositions.

More particularly, the invention relates to a thermosetting resin composition which contains a polyimide resin, a phenol resin, and an epoxy resin, and to a multilayer body and a circuit board each manufactured using such a thermosetting resin composition. The invention relates to a thermosetting resin composition which is excellent in dielectric characteristics, adhesiveness, processability, heat resistance, flowability, etc., and to a multilayer body and a circuit board each manufactured using such a thermosetting resin.

Furthermore, the invention relates to a thermosetting resin composition containing a polyimide resin, a phosphazene compound, and a cyanate ester compound, and to a multilayer body and a circuit board each manufactured using such a thermosetting resin composition. The invention relates to a thermosetting resin composition which is excellent in dielectric characteristics, processability, heat resistance, flame retardance, etc., and to a multilayer body and a circuit board each manufactured using such a thermosetting resin composition.

BACKGROUND ART

Recently, in order to improve information processing capability in electronic devices, frequencies of electrical signals transmitted through circuits on wiring boards have been increased. Consequently, even if the frequencies of electrical signals are increased, it is desired to maintain electrical reliability of wiring (circuit) boards and to prevent decreases in the transmission speed of electrical signals and loss of electrical signals in the circuits.

Meanwhile, the circuit boards are usually provided with protective films for protecting the wiring boards and circuits, and insulating layers, such as interlayer insulating films for ensuring insulation between the individual layers in multilayer wiring boards. Since the protective films and the insulating layers, such as interlayer insulating films, are disposed on the wiring boards, they are required to have adhesiveness so that they are bonded to the wiring boards, in addition to insulating properties. In particular, when multilayer wiring boards are manufactured by laminating flexible printed circuit boards (FPCs), build-up circuit boards, or the like, the individual boards are bonded and fixed to each other by the interlayer insulating films. Therefore, the interlayer insulating films are required to have excellent adhesion to the boards or the like. Accordingly, the protective films and the insulating layers, such as interlayer insulating films, are formed using adhesive materials having adhesiveness.

Consequently, in order to improve information processing capability in electronic devices by increasing the frequencies of electrical signals, even if insulating layers are formed using adhesive materials, it is desirable to obtain high reliability of wiring boards in the GHz (gigahertz) range and to avoid adverse effects on the transmission of electrical signals.

In the past, as the adhesive material for wiring boards, for example, an epoxy adhesive material or a thermoplastic polyimide adhesive material has been used. The epoxy adhesive material has excellent processability, such as capability of bonding adherends under low-temperature and low-pressure conditions, and also has excellent adhesiveness to adherends. The thermoplastic polyimide adhesive material has excellent heat resistance, such as low thermal expansion and high thermal decomposition temperature.

Furthermore, Japanese Unexamined Patent Application Publication No. 8-27430 (Publication Date: Jan. 30, 1996 (Heisei 8)) describes that use of a film adhesive prepared by mixing a polyimide resin having a glass transition temperature in a predetermined range, an epoxy compound, and a compound having an active hydrogen group reactive with the epoxy compound enables low-temperature, short-time bonding between adherends and achieves heat resistance reliability at high temperatures.

However, an epoxy resin obtained by curing the epoxy adhesive material has a dielectric constant of 4 or more and a dielectric loss tangent of 0.02 or more in the GHz range, resulting in a problem that satisfactory dielectric characteristics cannot be obtained.

Furthermore, with respect to an adhesive material using a polyimide resin obtained by curing the thermoplastic polyimide adhesive material, in order to allow adherends to adhere to each other using such a material, the adherends must be bonded to each other under high-temperature and high-pressure conditions, causing a problem in processability.

Furthermore, the film adhesive described in Japanese Unexamined Patent Application Publication No. 8-27430 can be processed at low temperatures for a short period of time and has excellent heat resistance reliability at high temperatures. However, the publication does not describe dielectric characteristics. The epoxy compound contained in the film adhesive described in Japanese Unexamined Patent Application Publication No. 8-27430 decreases the softening temperature of the film adhesive to improve low-temperature processability. However, if a large amount of the epoxy compound is incorporated, the dielectric constant and the dielectric loss tangent are increased, resulting in a degradation in dielectric characteristics.

Therefore, in order to improve information processing capability in electronic devices by increasing the frequencies of electrical signals, it is desired to develop an adhesive material which is excellent in adhesiveness, processability, and heat resistance and which is capable of forming insulating layers having excellent dielectric characteristics, i.e., exhibiting a low dielectric constant and a low dielectric loss tangent, even in the GHz range.

However, so far, with respect to resin compositions containing epoxy compounds and thermoplastic polyimide resins, there has not been provided a thermosetting resin composition which can be suitably used for manufacturing circuit boards, such as flexible printed circuit boards and build-up circuit boards, which is excellent in flowability, adhesiveness, processability, and heat resistance, and which has excellent dielectric characteristics in the GHz range.

Furthermore, recently, in view of environmental concerns, with respect to various materials used for electronic devices, there has been a need to take recycling into consideration and to avoid the use of environmentally unfriendly substances as much as possible. For example, with respect to flame retardants, non-halogen (halogen-free) flame retardants are desired, and with respect to solders, solders that do not contain lead (lead-free solders) are desired.

In particular, with respect to solders, in the past, eutectic solders containing lead have been mainly used as materials for physically and electrically connecting wiring boards and mounted parts. However, in view of environmental concerns, the lead-free solders that do not contain lead have come into common use. The lead free solders have melting points that are about 40° C. higher than those of conventional solders containing lead. Therefore, with respect to materials for wiring boards, there has been a strong demand for further improvement in heat resistance.

As resin materials used for wiring boards, in particular, adhesive materials and insulating materials used for the insulating layers, such as interlayer insulating films, and the protective films, curable resin compositions including polyimide resins and cyanate ester compounds are known as described above. However, such curable resin compositions have problems with respect to dielectric characteristics and processability. In order to overcome the problems in the epoxy adhesive materials and the thermoplastic polyimide adhesive materials, as a different system from that of resin compositions containing epoxy compounds and thermoplastic polyimides, Japanese Unexamined Patent Application Publication No. 2001-200157 (Publication Date: Jul. 24, 2001 (Heisei 13)) discloses a thermosetting resin composition containing a polyimide resin and a cyanate ester compound as an adhesive material (resin material) having excellent dielectric characteristics and processability.

Furthermore, Japanese Unexamined Patent Application Publication No. 8-8501 (Publication Date; Jan. 12, 1996 (Heisei 8)) discloses a low dielectric constant multilayer printed circuit board which contains a cyanate ester compound as a main component and which has flame retardance. Furthermore, Japanese Unexamined Patent Application Publication No. 9-132710 (Publication Date: May 20, 1997 (Heisei 9)) discloses a polyimide resin composition having excellent adhesiveness.

However, these conventional techniques, in particular, in the application of manufacturing wiring boards that meet the requirement of improving information processing capability in electronic devices, have difficulty in improving various physical properties of resin materials in a well-balanced manner. More specifically, with respect to the conventional techniques, in the resin materials used in the above-described application, it is difficult to satisfy the requirements of both flame retardance and other physical properties, such as heat resistance, processability (including solvent solubility), and dielectric characteristics.

For example, in the thermosetting resin composition disclosed in Japanese Unexamined Patent Application Publication No. 2001-200157, a polyimide resin is mixed with a cyanate ester compound, and this thermosetting resin composition is effective in satisfying the requirements of dielectric characteristics, heat resistance, and processability. However, there is no description in the publication of flame retardance, which is an important property of the material constituting circuit boards. Therefore, it is not clear if the thermosetting resin composition has sufficient flame retardance.

The low dielectric constant multilayer printed circuit board disclosed in Japanese Unexamined Patent Application Publication No. 8-8501 is composed of a material prepared by mixing a cyanate ester compound and brominated bisphenol A. Because of the use of the brominated phenol, the multilayer printed circuit board has flame retardance that is sufficient for use in a wiring board. Furthermore, the polyimide resin composition disclosed in Japanese Unexamined Patent Application Publication No. 8-8501 includes a halogen atom or a halogen-containing hydrocarbon group. That is, in spite of the fact that recently flame-retardant materials that do not include halogen compounds have been strongly desired in view of environmental concerns, a halogen compound is used.

Accordingly, so far, there has not been provided a thermosetting resin composition in which it is possible to sufficiently satisfy the requirements of both flame retardance and other physical properties, such as dielectric characteristics, heat resistance, and processability (including solvent solubility), in view of environmental concerns, and in particular, which can be suitably used in manufacturing wiring boards that satisfactorily meet the requirement of improving information processing capability in electronic devices.

DISCLOSURE OF INVENTION

In order to overcome the problems described above, the present inventors have found that by using a thermosetting resin composition containing a polyimide resin, a phenol resin, and an epoxy resin as essential components, the epoxy resin and the phenol resin being mixed at a predetermined ratio with the polyimide resin, it is possible to obtain a thermosetting resin composition which is excellent in flowability required for embedding a circuit, adhesiveness to an adherend, such as a circuit board, processability and handleability enabling bonding at low temperatures, and heat resistance with respect to thermal expansion and thermal decomposition, and which is capable of being cured to produce a cured resin having excellent dielectric characteristics, i.e., exhibiting a low dielectric constant and a low dielectric loss tangent, in the GHz range.

That is, in order to overcome the problems described above, a thermosetting resin composition of the present invention contains at least a polyimide resin component (A) containing at least one polyimide resin, a phenol resin component (B) containing at least one phenol resin, and an epoxy resin component (C) containing at least one epoxy resin. The mixing ratio by weight $(A)/[(B)+(C)]$ is in a range of 0.4 to 2.0, the mixing ratio by weight being the ratio of the weight of the polyimide resin component (A) to the total weight of the phenol resin component (B) and the epoxy resin component (C).

Preferably, the mixing ratio by mole $(B)/(C)$ is in a range of 0.4 to 1.2, the mixing ratio by mole being the ratio of the number of moles of the hydroxyl group of the phenol resin contained in the phenol resin component (B) to the number of moles of the epoxy group of the epoxy resin contained in the epoxy resin component (C).

In accordance with the constituent features described above, a cured resin obtained by curing the thermosetting resin composition exhibits a low dielectric constant and a low dielectric loss tangent even in the GHz range, and thus excellent dielectric characteristics can be achieved. Specifically, with respect to a cured resin obtained by heating the thermosetting resin composition in a temperature range of 150° C. to 250° C. for 1 to 5 hours, the dielectric constant can be set at 3.3 or less and the dielectric loss tangent can be set at 0.020 or less in a frequency range of 1 to 10 GHz. If the dielectric constant is 3.3 or less and the dielectric loss tangent is 0.020 or less in the GHz range, when the thermosetting resin composition of the present invention is used as a protective material or an interlayer insulating material of a circuit board, electrical reliability of the circuit board is ensured, and it is possible to prevent decreases in the transmission speed of signals and loss of signals in the circuit on the circuit board.

Furthermore, the thermosetting resin composition of the present invention has excellent flowability required for embedding a circuit, excellent heat resistance, such as low thermal expansion coefficient and high thermal decomposition temperature, excellent adhesiveness between the thermosetting resin composition and an adherend, such as a conductor or a circuit board, and excellent processability during bonding between the thermosetting resin composition and a conductor or a circuit board. Consequently, the thermosetting resin composition can be suitably used for manufacturing circuit boards, such as flexible printed circuit boards and build-up circuit boards.

As described above, the thermosetting resin composition of the present invention has the properties in a well-balanced manner. Therefore, the thermosetting resin composition can be suitably used for manufacturing circuit boards and can impart good properties to circuit boards obtained using the thermosetting resin composition of the present invention.

Preferably, the at least one polyimide resin contained in the polyimide resin component (A) is produced by reacting an acid dianhydride component containing at least one acid dianhydride represented by general formula (1):

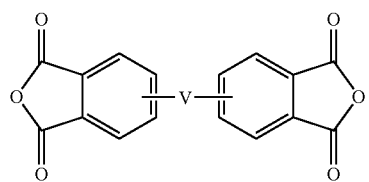
(1)

(wherein V represents a divalent group selected from the group consisting of —O—, —CO—, —O-T-O—, and —COO-T-OCO—, T representing a divalent organic group) with a diamine component containing at least one diamine.

Preferably, the phenol resin component (B) contains at least one phenol resin selected from the group consisting of compounds having structures represented by the formulae:

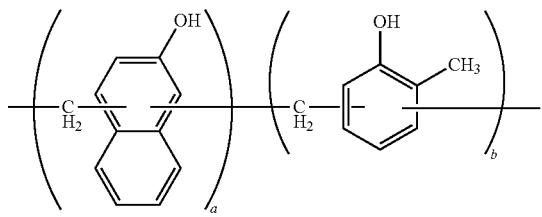

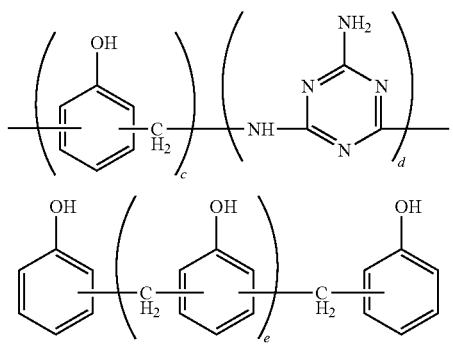

(wherein a, b, a, d, and e each represent an integer of 1 to 10).

Preferably, the epoxy resin component (C) contains at least one epoxy resin selected from the group consisting of compounds having structures represented by the formulae:

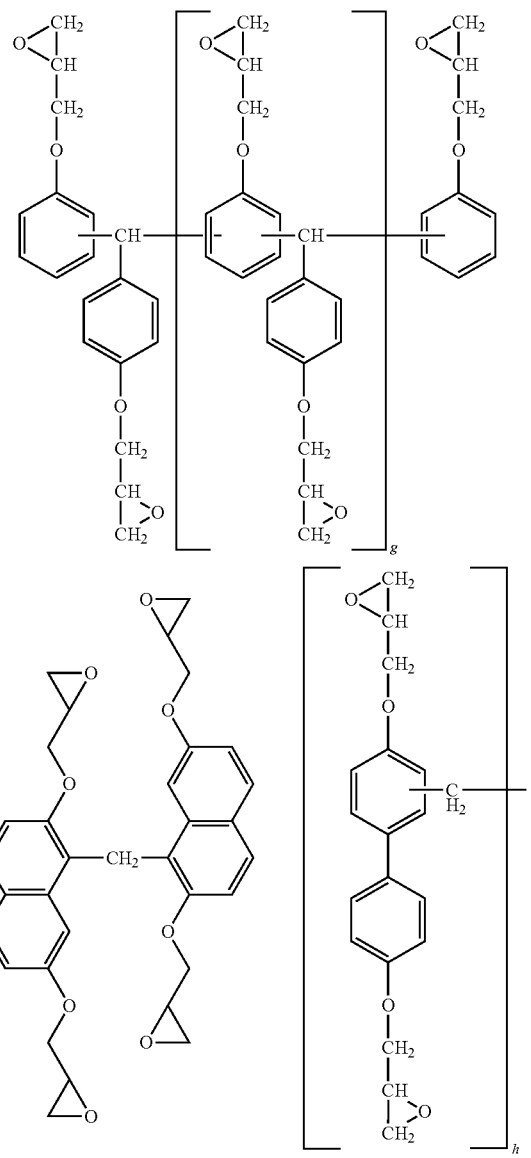

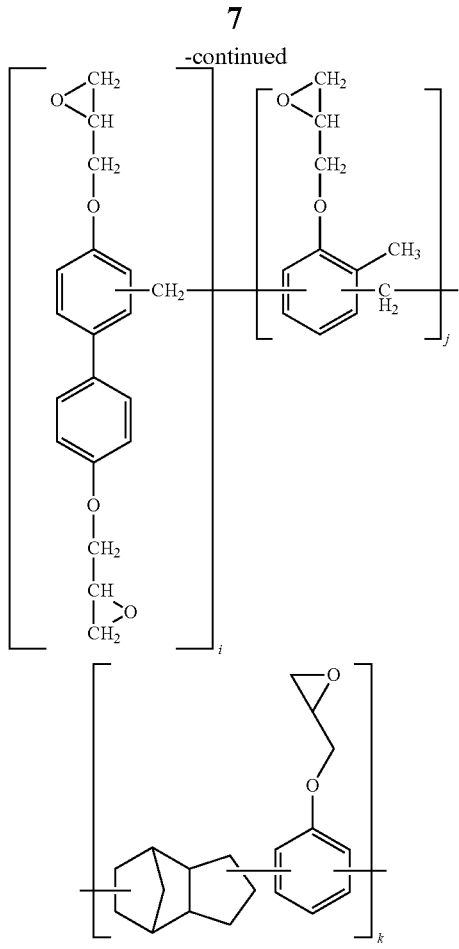

(wherein g, h, i, j, and k each represent an integer of 1 to 10).

Thereby, it is possible to impart excellent properties, such as dielectric characteristics, flowability, heat resistance, adhesiveness, and processability, in a well-balanced manner, to the thermosetting resin composition or a cured resin obtained by curing the thermosetting resin composition.

Furthermore, in order to overcome the problems described above, a multilayer body of the present invention includes at least one resin layer formed of the thermosetting resin composition described above containing the polyimide resin, the phenol resin, and the epoxy resin as essential components, the epoxy resin and the phenol resin being mixed at a predetermined ratio with the polyimide resin.

Furthermore, in order to overcome the problems described above, a circuit board of the present invention includes the thermosetting resin composition described above.

The multilayer body and the circuit board each include the thermosetting resin composition. Therefore, it is possible to impart, in a well-balanced manner, various properties, such as dielectric characteristics, flowability, heat resistance, adhesiveness, and processability, to the resin layers formed of the thermosetting resin composition in the multilayer body and the circuit board. Consequently, the multilayer body and the circuit board can be manufactured advantageously. In particular, when the multilayer body and the circuit board are each provided with circuits or the like, electrical reliability of the individual circuits is ensured, and it is possible to prevent decreases in the transmission speed of signals and loss of signals in the individual circuits.

The present inventors have also found that by selecting a combination of a polyimide resin, a specific phosphazene compound, and a cyanate ester compound serving as components of a thermosetting resin composition, it is possible to enhance a balance between flame retardance and other physical properties.

That is, a thermosetting resin composition of the present invention contains at least a polyimide resin (A) containing at least one polyimide resin, a phosphazene compound (D) containing at least one phosphazene compound, and a cyanate ester compound (E) containing at least one cyanate ester compound. The phosphazene compound (D) includes a phenolic hydroxyl group-containing phenoxyphosphazene compound (D-1) and/or a crosslinked phenoxyphosphazene compound (D-2) prepared by crosslinking the phenoxyphosphazene compound (D-1), the crosslinked phenoxyphosphazene compound (D-2) having at least one phenolic hydroxyl group.

In the thermosetting resin composition, preferably, the mixing ratio by weight (B)/[(A)+(D)+(E)] is in a range of 0.01 to 0.4, the mixing ratio by weight being the ratio of the weight of the phosphazene compound (D) to the total weight of the polyimide resin (A), the phosphazene compound (D), and the cyanate ester compound (E).

Furthermore, in the thermosetting resin composition, preferably, the phenoxyphosphazene compound (D-1) includes at least a cyclic phenoxyphosphazene compound (D-11) represented by general formula (2):

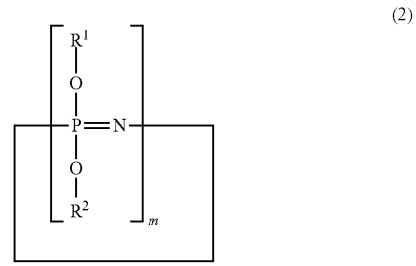

(wherein m represents an integer of 3 to 25; $R^1$ and $R^2$ each represent a phenyl group or a hydroxyphenyl group; and at least one hydroxyphenyl group is contained per molecule) and/or a linear phenoxyphosphazene compound (D-12) represented by general formula (3):

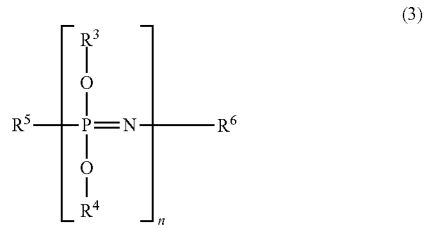

(wherein n represents an integer of 3 to 10,000; $R^3$ and $R^4$ each represent a phenyl group or a hydroxyphenyl group; at least one hydroxyphenyl group is contained per molecule; $R^5$ represents —N=P(OC$_6$H$_5$)$_3$, —N=P(OC$_6$H$_5$)$_2$(OC$_6$H$_4$OH), —N=P(OC$_6$H$_5$)(OC$_6$H$_4$OH)$_2$, —N=P(OC$_6$H$_4$OH)$_3$, —N—P(O)OC$_6$H$_5$, or —N=P(O)(OC$_6$H$_4$OH); and $R^6$ represents —P(OC$_6$H$_5$)$_4$, —P(OC$_6$H$_5$)$_3$(OC$_6$H$_4$OH), —P(OC$_6$H$_5$)$_2$(OC$_6$H$_4$OH)$_2$, —P(OC$_6$H$_5$)(OC$_6$H$_4$OH)$_3$, —P(OC$_6$H$_4$OH)$_4$, —P(O)(OC$_6$H$_5$)$_2$, —P(O)(OC$_6$H$_5$)(OC$_6$H$_4$OH), or —P(O)(OC$_6$H$_4$OH)$_2$).

Furthermore, in the thermosetting resin composition, preferably, the crosslinked phenoxyphosphazene compound (D-2) is prepared by crosslinking the phenoxyphosphazene compound with a phenylene-based crosslinking group containing at least any one of an o-phenylene group, an m-phenylene group, a p-phenylene group, and a bisphenylene group represented by general formula (4):

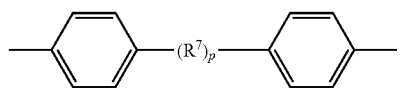

(4)

(wherein $R^7$ represents $-C(CH_3)_2-$, $-SO_2-$, $-S-$, or $-O-$; and p represents 0 or 1).

More preferably, the crosslinked phenoxyphosphazene compound is a phenylene-based crosslinked phenoxyphosphazene compound (D-21) having at least one phenolic hydroxyl group, in which the cyclic phenoxyphosphazene compound (D-11) and/or the linear phenoxyphosphazene compound (D-12) are used as the phenoxyphosphazene compound, and the phenylene-based crosslinking group lies between two oxygen atoms of the phenoxyphosphazene compound (D-1), the phenyl group and the hydroxyphenyl group being separated from the oxygen atoms, and the content of the phenyl group and the hydroxyphenyl group in the crosslinked phenoxyphosphazene compound is in a range of 50% to 99.9% based on the total number of phenyl groups and hydroxyphenyl groups contained in the phenoxyphosphazene compound.

In the thermosetting resin composition, preferably, the polyimide resin (A) contains a soluble polyimide resin.

Furthermore, in the thermosetting resin composition, preferably, the polyimide resin (A) dissolves in an amount of 1% by weight or more in at least one organic solvent selected from the group consisting of dioxolane, dioxane, tetrahydrofuran, N,N-dimethylformamide, N,N-dimethylacetamide, and N-methyl-2-pyrrolidone in a temperature range of 15° C. to 100° C.

Furthermore, in the thermosetting resin composition, preferably, the polyimide resin (A) contains at least one component for imparting organic solvent solubility which is selected from the group consisting of an aliphatic compound component, an alicyclic compound component, and a bisphenol compound-alkylene oxide adduct component, so as to exhibit solubility in a mixed solvent containing a low-boiling organic solvent.

Furthermore, in the thermosetting resin composition, preferably, the polyimide resin (A) is produced by reacting an acid dianhydride component with a diamine component or an isocyanate component, and the acid dianhydride component contains at least an acid dianhydride represented by general formula (1):

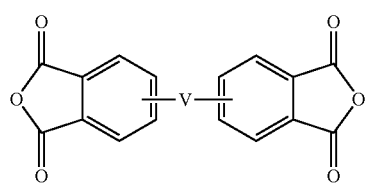

(1)

(wherein V represents a direct bond, $-O-$, $-O-T-O-$, $-O-CO-T-CO-O-$, $-(C=O)-$, $-C(CF_3)_2-$, or $-C(CH_3)_2-$, T representing a divalent organic group).

Alternatively, preferably, the polyimide resin (A) is produced by reacting an acid dianhydride component with a diamine component or an isocyanate component, and the diamine component or the isocyanate component contains at least any one of a siloxane diamine, a diamine containing a hydroxyl group and/or a carboxyl group, a diamine having amino groups at the meta positions, a diamine having amino groups at the ortho positions, an isocyanate having an amino group at the meta position, and an isocyanate having an amino group (isocyanato group) at the ortho position.

In the thermosetting resin composition, preferably, the cyanate ester compound (E) includes at least one compound selected from the group consisting of compounds represented by the group of general formulae (1):

Group of general formulae (1)

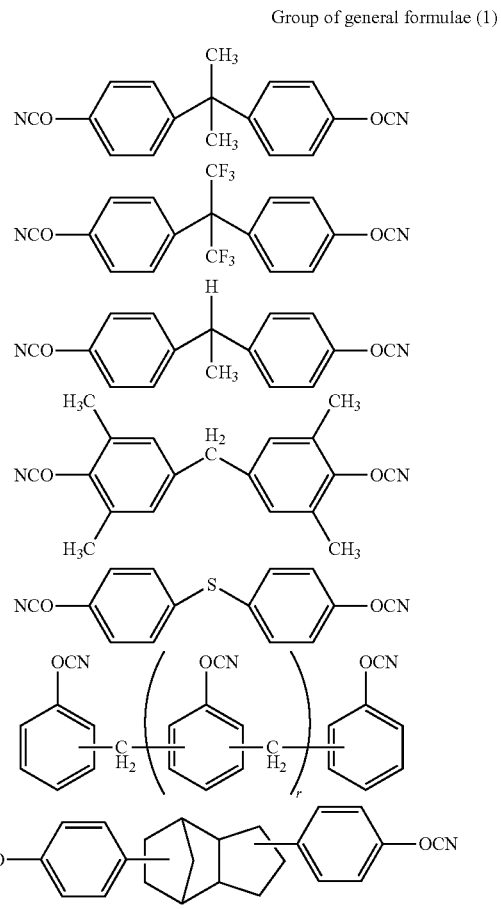

(wherein r represents 0 to 4).

Furthermore, in order to overcome the problems described above, a multilayer body of the present invention includes at least one resin layer formed of the thermosetting resin composition described above containing the polyimide resin (A), at least one of the phenoxyphosphazene compound (D-1) and the crosslinked phenoxyphosphazene compound (D2), and the cyanate ester compound (E).

Furthermore, in order to overcome the problems described above, a circuit board of the present invention includes the thermosetting resin composition described above.

The multilayer body and the circuit board each include the thermosetting resin composition. Therefore, it is possible to impart excellent heat resistance, dielectric characteristics, and flame retardance to the resin layers formed of the thermosetting resin composition in the multilayer body and the circuit board. Since the thermosetting resin composition enables bonding at a lower temperature compared with the conventional thermoplastic polyimide resin-based adhesive material, excellent processability is also imparted to the resin layers. Moreover, since the cyanate ester compound is used, various properties, such as processability, heat resistance, and dielectric characteristics, are better balanced compared with the conventional polyimide/epoxy resin mixed adhesives. Furthermore, since the hydroxyl group-containing phosphazene compound is used, the hydroxyl group can react with the ester group of the cyanate ester compound. Thereby, the structure of the phosphazene compound can be incorporated into the network structure of the cured resin, thus improving flame retardance without impairing heat resistance. Consequently, the thermosetting resin composition of the present invention enables bonding at lower temperatures compared with conventional compositions, is excellent in processability and handleability, and is capable of exhibiting excellent heat resistance, dielectric characteristics, and flame retardance.

As a result, for example, when the thermosetting resin composition of the present invention is formed into a varnish solution or the like, it is possible to produce a resin preparation useful as an adhesive, a coating material, an ink, or the like. Furthermore, when the thermosetting resin composition of the present invention is formed into resin sheets or resin films, the resin sheets or the resin films can be suitably used as multilayer bodies, such as circuit boards, e.g., flexible printed circuit boards (FPCs) and build-up circuit boards, and laminating materials constituting such multilayer bodies.

BEST MODE FOR CARRYING OUT THE INVENTION

An embodiment of the present invention will be described below. It is to be understood that the present invention is not limited thereto.

A thermosetting resin composition of the present invention can be used for circuit boards, such as flexible printed circuit boards and build-up circuit boards. The thermosetting resin composition can be used as a protecting material for protecting the circuit boards or circuits patterned on the circuit boards, or an interlayer insulating material for ensuring insulation between the individual layers in multilayer circuit boards.

(First Embodiment)

A thermosetting resin composition according to a first embodiment of the present invention contains, as essential components, a polyimide resin component (A) containing at least one polyimide resin, a phenol resin component (B) containing at least one phenol resin, and an epoxy resin component (C) containing at least one epoxy resin. With respect to the mixing ratio of the individual components in the thermosetting resin composition, in the mixing ratio by weight (A)/[(B)+(C)], i.e., the ratio of the weight of the polyimide resin component (A) to the total weight of the phenol resin component (B) and the epoxy resin component (C), the lower limit is preferably 0.4 or more, and more preferably 0.5 or more. Furthermore, in the mixing ratio by weight (A)/[(B)+(C)], the upper limit is preferably 2.0 or less, and more preferably 1.5 or less.

If the mixing ratio by weight becomes less than 0.4, i.e., if the content of the phenol resin component (B) and the epoxy resin component (C) in the thermosetting resin composition becomes relatively larger than the content of the polyimide resin component (A), in a resin sheet before curing, flowability increases and minimum complex viscosity decreases. Furthermore, in a resin sheet after curing, although heat resistance, which is represented by modulus of elasticity, coefficient of linear expansion, and the like, at high temperatures increases, it becomes difficult to achieve a low dielectric constant and a low dielectric loss tangent (hereinafter referred to as excellent dielectric characteristics) in the GHz (gigahertz) range.

On the other hand, if the mixing ratio by weight exceeds 2.0, i.e., if the content of the polyimide resin component (A) in the thermosetting resin composition becomes relatively larger than the content of the phenol resin component (B) and the epoxy resin component (C), although excellent dielectric characteristics can be exhibited in the cured resin in the GHz range, adhesiveness between the thermosetting resin composition and a conductor or a circuit board, and processability during bonding between the thermosetting resin composition and a conductor or a circuit board are degraded.

In the thermosetting resin composition of the present invention, by setting the mixing ratio by weight in the range described above, a cured resin obtained by curing the thermosetting resin composition exhibits excellent dielectric characteristics even in the GHz range. That is, with respect to the dielectric characteristics of a cured resin obtained by heating the thermosetting resin composition at a temperature of 150° C. to 250° C. for 1 to 5 hours, the dielectric constant is 3.3 or less and the dielectric loss tangent is 0.020 or less at a frequency of 1 to 10 GHz. If the dielectric constant and the dielectric loss tangent are in the ranges described above, when the thermosetting resin composition of the present invention is used as a protective material or an interlayer insulating material in a circuit board, it is possible to ensure electrical insulation of the circuit board and to prevent decreases in the transmission speed of signals and loss of signals in the circuit on the circuit board. Therefore, a highly reliable circuit board can be provided.

Furthermore, in the thermosetting resin composition of the present invention, with respect to the mixing ratio by mole (B)/(C), i.e., the ratio of the number of moles of the hydroxyl group of the phenol resin contained in the phenol resin component (B) to the number of moles of the epoxy group of the epoxy resin contained in the epoxy resin component (C), the lower limit is preferably 0.4 or more, and more preferably 0.7 or more. Furthermore, the upper limit of the mixing ratio by mole (B)/(C) is preferably 1.2 or less, and more preferably 1.1 or less.

If the mixing ratio by mole (B)/(C) becomes less than 0.4 or exceeds 1.2, the dielectric characteristics of a cured resin obtained by curing the thermosetting resin composition are adversely affected. Furthermore, the glass transition temperature, the thermal expansion coefficient, and the modulus of elasticity at high temperatures of the thermosetting resin composition are decreased, and the heat resistance is also degraded.

Additionally, the number of moles of the epoxy group and the number of moles of the hydroxyl group are respectively calculated from the epoxy value and the hydroxyl value.

As described above, in the thermosetting resin composition, by setting the compounding ratio of the polyimide resin (A), the phenol resin (B), and the epoxy resin (C) in a specific range, it is possible to obtain a thermosetting resin composition which is excellent, in a well-balanced manner, in flowability required for embedding a circuit, adhesiveness to an adherend, such as a circuit board or a conductor, processability and handleability enabling bonding at low temperatures, heat resistance with respect to thermal expansion and thermal decomposition, resistance to humidity test using a pressure cooker (PCT), resistance to soldering heat, insulating properties, and dielectric characteristics of a cured resin obtained by curing the thermosetting resin composition.

The polyimide resin component (A), the phenol resin component (B), the epoxy resin component (C), and other components (F) contained in the thermosetting resin composition will be described in detail below.

(A) Polyimide Resin Component

In the thermosetting resin composition of the present invention, incorporation of a polyimide resin component (A) containing at least one polyimide resin imparts heat resistance to the thermosetting resin composition, imparts flexibility, excellent mechanical characteristics, and chemical resistance to a cured resin obtained by curing the thermosetting resin composition, and also imparts excellent dielectric characteristics, i.e., a low dielectric constant and a low dielectric loss tangent in the GHz range, to the cured resin.

The polyimide resin is not particularly limited, but is preferably a soluble polyimide resin that dissolves in an organic solvent. Herein, the term "soluble polyimide resin" means a polyimide resin that dissolves in an amount of 1% by weight or more in an organic solvent in a temperature range of 15° C. to 100° C.

Examples of the organic solvent which may be used include at least one solvent selected from ether solvents, such as dioxane, dioxolane, and tetrahydrofuran; acetamide solvents, such as N,N-dimethylformamide and N,N-diethylacetamide; formamide solvents, such as N,N-diethylformamide; N,N-dimethylacetamide; and pyrrolidone solvents, such as N-methyl-2-pyrrolidone and N-vinyl-2-pyrrolidone.

By using the soluble polyimide resin, when the thermosetting resin composition of the present invention is thermally cured, high-temperature, long-time processing is not required, and the phenol resin component (B) and the epoxy resin component (C), which will be described below, can be cured efficiently. Furthermore, when the soluble polyimide is used as the polyimide resin (A) in the thermosetting resin according to the second embodiment, which will be described below, the cyanate ester compound (E) can be cured efficiently. Consequently, use of a soluble polyimide resin as the polyimide resin is preferable in view of processability.

The polyimide resin (A) is a resin whose backbone contains an imide ring as a repeating unit. Specifically, examples of the polyimide resin (A) include polyimides (resins containing imide rings only, i.e., polyimide resins in a narrow sense) and polyimide resins in a broad sense having repeating units other than imide rings, such as polyamideimides, polyesterimides, polyetherimides, and maleimides.

As will be described below, the polyimide resin (A) is generally produced by any of the following two methods. In a first method, an acid dianhydride component and a diamine component are used as starting monomer components, these monomer components are reacted and polymerized to form polyamic acid, and the polyamic acid is imidized to produce a polyimide resin. In a second method, an acid dianhydride component and an isocyanate component are used as starting monomer components, and these monomer components are reacted to produce a polyimide resin.

The specific structure of the polyimide resin (A) is not particularly limited. In the present invention, by using an acid dianhydride and a diamine or an isocyanate each having a specific structure described below as the monomer components, it is possible to produce a polyimide resin (A) that is more suitable for the thermosetting resin composition of the present invention. Additionally, a method for producing the polyimide resin (A) will be described later.

<Acid Dianhydride Component>

In the present invention, any acid dianhydride component can be used as a starting material for the polyimide resin (A) without limitation as long as the acid dianhydride is capable of producing a polyimide resin that has solubility in various types of organic solvent, heat resistance, and compatibility with the phenol resin component (B), the epoxy resin component (C), and the cyanate ester compound (E) if used as the polyimide resin (A) in the second embodiment, which will be described below. Preferably, the acid dianhydride component is an aromatic tetracarboxylic dianhydride. Specifically, the acid dianhydride component preferably contains at least an acid dianhydride (for the convenience of description, referred to as an "aromatic tetracarboxylic dianhydride") represented by general formula (1):

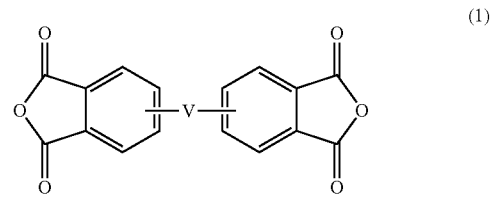

(wherein V represents a direct bond, —O—, —O-T-O—, —O—CO-T-CO—O—, —(C=O)—, —C(CF3)2-, or —C(CH3)2-, T representing a divalent organic group).

If the aromatic tetracarboxylic dianhydride represented by general formula (1) is used, the resulting polyimide resin (A) can have improved solubility in an organic solvent, improved heat resistance, and improved compatibility with the phenol resin component, the epoxy resin component, and the cyanate ester compound (E), if used for the thermosetting resin in the second embodiment which will be described below.

Among the aromatic tetracarboxylic dianhydrides represented by general formula (1), more preferred for use is an acid dianhydride (for the sake of description, referred to as a "phenylene-based aromatic tetracarboxylic dianhydride") in which T in general formula (1) represents any of divalent organic groups (organic groups having one or two benzene rings) selected from the following group (2):

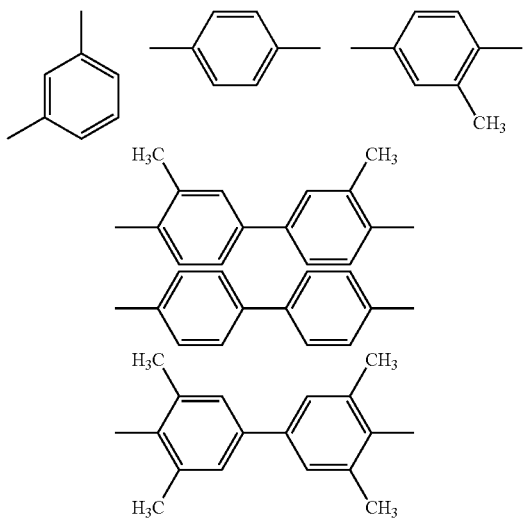

-continued

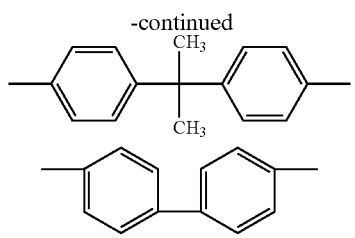

and divalent organic groups represented by general formula (7):

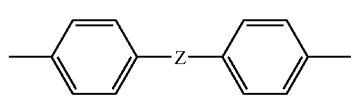

(7)

(wherein Z represents —C$_Q$H$_{2Q}$—, —C(=O)—, —SO$_2$—, —O—, or —S—, Q representing an integer of 1 to 5). These phenylene-based aromatic tetracarboxylic dianhydrides may be used alone or two or more of these may be combined appropriately. By using such an acid dianhydride, in the resulting polyimide resin (A) and thermosetting resin composition, excellent dielectric characteristics (a low dielectric constant and a low dielectric loss tangent in the GHz range) and excellent heat resistance can be exhibited.

Furthermore, among the phenylene-based aromatic tetracarboxylic dianhydrides, use of 4,4'-(4,4'-isopropylidenediphenoxy)bisphthalic dianhydride represented by the following formula:

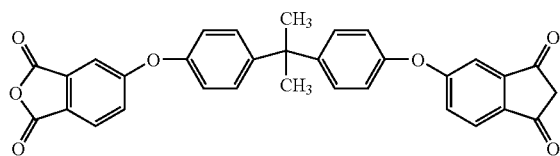 [SMILES: CC(C)(c1ccc(Oc2ccc3c(c2)C(=O)CC3=O)cc1)c1ccc(Oc2ccc3c(c2)C(=O)OC3=O)cc1]

is particularly preferable. By using this acid dianhydride, in the resulting polyimide resin (A) and thermosetting resin composition, various properties, such as solvent solubility, heat resistance, compatibility with the cyanate ester compound component, compatibility with the cyanate ester compound (E) if used in the second embodiment of the thermosetting resin, which will be described below, and dielectric characteristics can be better balanced. Furthermore, 4,4'-(4, 4'-isopropylidenediphenoxy)bisphthalic dianhydride is easily available, which is advantageous.

The acid dianhydride component used in the present invention preferably contains at least an aromatic tetracarboxylic dianhydride represented by general formula (1). Furthermore, by specifying the content of the acid dianhydride represented by general formula (1) in the total acid dianhydrides, it is possible to produce a polyimide resin (A) having excellent physical properties.

Specifically, the aromatic tetracarboxylic dianhydride is preferably used in an amount of 50 mole percent or more based on 100 mole percent of the total acid dianhydride component used as the starting material. Thereby, in the resulting polyimide resin (A), excellent solvent solubility, excellent compatibility with the epoxy resin, the cyanate ester compound, etc., and excellent dielectric characteristics can be exhibited.

The acid dianhydride component can contain only one of the acid dianhydrides represented by general formula (1) or two or more of these in combination in any ratio. Moreover, the acid dianhydride component may contain an acid dianhydride having a structure other than the structure represented by general formula (1) (hereinafter referred to as "the other acid dianhydride").

Specific examples of the other acid dianhydride which may be used in the present invention include, but are not limited to, anhydrides of pyromellitic acid, 1,2,3,4-benzenetetracarboxylic acid, 1,2,3,4-cyclobutanetetracarboxylic acid, 1,2,4,5-cyclopentanetetracarboxylic acid, 1,2,4,5-cyclohexanetetracarboxylic acid, 3,3',4,4'-bicyclohexyltetracarboxylic acid, 2,3,5-tricarboxycyclopentylacetic acid, 3,4-dicarboxy-1,2,3,4-tetrahydronaphthalene-1-succinic acid, bis(3,4-dicarboxyphenyl)methane, bis(2,3-dicarboxyphenyl)methane, 1,1-bis(2,3-dicarboxyphenyl)ethane, 3,3',4,4'-diphenylsulfonetetracarboxylic acid, 2,3,3'4'-diphenylsulfonetetracarboxylic acid, 2,3,6,7-naphthalenetetracarboxylic acid, 1,4,5,8-naphthalenetetracarboxylic acid, 1,2,5,6-naphthalenetetracarboxylic acid, 3,4,9,10-tetracarboxyperylene acid, 2,2-bis[4-(3,4-dicarboxyphenoxy)phenyl]propanoic acid, 2,2-bis[4-(3,4-dicarboxyphenoxy)phenyl]hexafluoropropanoic acid, 3,3',4, 4'-dimethyldiphenylsilanetetracarboxylic acid, 1,2,3,4-furantetracarboxylic acid, 4,4'-bis(3,4-dicarboxyphenoxy) diphenylpropanoic acid, 4,4'-hexafluoroisopropylidenediphthalic acid, and p-phenylenediphthalic acid, and lower alkyl esters thereof.

These compounds may be used alone or in appropriate combination of two or more. As described above, it is extremely preferable to use at least one acid dianhydride represented by general formula (1).

Among the compounds described above, particularly preferred for use are anhydrides of 2,3,3',4'-biphenyl ether tetracarboxylic acid, 2,2-bis(3,4-dicarboxyphenyl) hexafluoropropane, 4,4'-(4,4'-isopropylidenediphenoxy)bisphthalic acid, 2,2'-bis(4-hydroxyphenyl)propanedibenzoate-3,3',4,4'-tetracarboxylic acid, 1,2-bis(4-hydroxyphenyl)ethylenedibenzoate-3,3',4,4'-tetracarboxylic acid, 2,3,3',4'-biphenyltetracarboxylic acid, or lower alkyl esters thereof. Thereby, in the resulting polyimide resin (A), solvent solubility and heat resistance can be better balanced. Among these compounds, the aromatic tetracarboxylic dianhydride is preferable, and the phenylene-based aromatic tetracarboxylic dianhydride (e.g., 4,4'-(4,4'-isopropylidenediphenoxy)bisphthalic acid) is more preferable.

<Diamine Component>

With respect to the polyimide resin (A) suitably used in the present invention, among the starting materials, the diamine component is not particularly limited. The diamine component used in the present invention is preferably a diamine capable of producing the polyimide resin (A) in which excellent solubility in various types of organic solvent, heat resistance, resistance to soldering heat, PCT resistance, low water absorption, and thermoplasticity are exhibited. Examples of such a diamine component include a diamine containing an aromatic structure, such as a benzene ring (phenyl group).

Specifically, the diamine component preferably contains a diamine (for the convenience of description, referred to as an "aromatic diamine") represented by general formula (8):

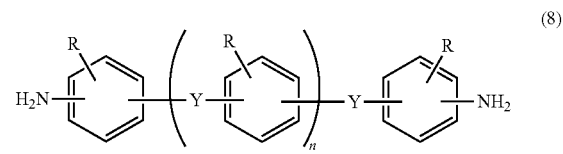

(8)

(wherein each Y independently represents —C(=O)—, —SO2-, —O—, —S—, —(CH2)m-, —NHCO—, —C(CH3)2-, —C(CF3)2-, —C(=O)O—, or a direct bond; each R represents a hydrogen atom, a halogen atom, or an alkyl group having 1 to 4 carbon atoms; and m and r each independently represent an integer of 1 to 5). By using such an aromatic diamine, in the resulting polyimide resin (A), excellent solubility and heat resistance and low water absorption can be exhibited. Additionally, a plurality of Ys, which are repeating units in general formula (8), may be the same or different.

Examples of the aromatic diamine represented by general formula (8) include, but are not limited to, bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[4-(3-aminophenoxy)phenyl]butane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis(3-aminophenoxy)benzene, 1,4-bis(3-aminophenoxy)benzene, 1,4'-bis(4-aminophenoxy)benzene, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(2-aminophenoxy)phenyl]sulfone, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, bis[4-{4-(4-aminophenoxy)phenoxy}phenyl]sulfone, 1,4-bis[4-(4-aminophenoxy)-α,α-dimethylbenzyl]benzene, 1,3-bis[4-(4-aminophenoxy)-α,α-dimethylbenzyl]benzene, 4,4'-diaminodibenzyl sulfoxide, bis(4-aminophenoxy)phenylphosphine oxide, bis(4-aminophenoxy)-N-phenylamine, and 2,2-bis[4-(4-aminophenoxy)phenyl]hexafluoropropane. These diamines may be used alone or in appropriate combination of two or more.

Among the aromatic diamines represented by general formula (8), from the standpoint of improving solubility in various types of solvent, an aromatic diamine having amino groups at the meta positions or the ortho positions is preferable. In particular, a diamine represented by general formula (9):

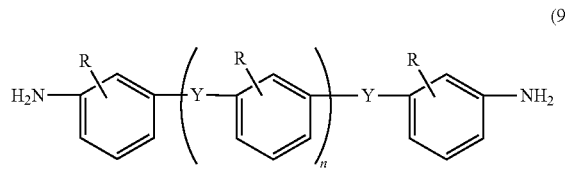

(9)

(wherein each Y independently represents —C(=O)—, —SO$_2$—, —O—, —S—, —(CH$_2$)$_m$—, —NHCO—, —C(CH$_3$)$_2$—, —C(CF$_3$)$_2$—, —C(=O)O—, or a direct bond; each R represents a hydrogen atom, a halogen atom, or an alkyl group having 1 to 4 carbon atoms; and m and r each independently represent an integer of 1 to 5), i.e., an aromatic diamine having amino groups at the meta positions (for the convenience of description, referred to as a "meta-aromatic diamine"), is more preferable. If such an aromatic diamine is used, the resulting polyimide resin (A) can have more excellent solubility compared with the case in which an aromatic diamine having amino groups at the para positions is used.

Examples of the aromatic diamine represented by general formula (8) include 1,1-bis[4-(3-aminophenoxy)phenyl]ethane, 1,2-bis[4-(3-aminophenoxy)phenyl]ethane, 2,2-bis[4-(3-aminophenoxy)phenyl]propane, 2,2-bis[4-(3-aminophenoxy)phenyl]butane, 2,2-bis[3-(3-aminophenoxy)phenyl]-1,1,1,3,3,3-hexafluoropropane, 1,3-bis(3-aminophenoxy)benzene, 1,4-bis(3-aminophenoxy)benzene, bis[4-(3-aminophenoxy)phenyl]ketone, bis[4-(3-aminophenoxy)phenyl]sulfide, bis[4-(3-aminophenoxy)phenyl]sulfone, bis[4-(3-aminophenoxy)phenyl]ether, 1,4-bis[4-(3-aminophenoxy)benzoyl]benzene, 1,3-bis[4-(3-aminophenoxy)benzoyl]benzene, and 4,4'-bis[3-(3-aminophenoxy)benzoyl]diphenyl ether.

Among the aromatic diamines described above, use of 1,3-bis(3-aminophenoxy)benzene is particularly preferable. By using this aromatic diamine, in the resulting polyimide resin (A) and thermosetting resin composition, physical properties, such as solubility in various types of solvent, resistance to soldering heat, and PCT resistance, can be further improved.

Furthermore, in the present invention, as the diamine component, a diamine having a hydroxyl group and/or a carboxyl group is also preferably used. If the diamine having a hydroxyl group and/or a carboxyl group is used, at least one of the hydroxyl group and the carboxyl group is introduced into the resulting polyimide resin (A). The hydroxyl group and the carboxyl group can promote the curing of the thermosetting component.

Therefore, in the polyimide resin (A) prepared using the diamine having the hydroxyl group and/or carboxyl group, it is possible to cure the phenol resin (B) and the epoxy resin (C), which are thermosetting components, or the cyanate ester compound (E) when used as the polyimide resin (A) in the second embodiment, at low temperatures or in a short period of time. Furthermore, since the cyanate ester compound is reactable with the hydroxyl group and/or the carboxyl group, crosslinking through the epoxy resin is enabled in the resulting polyimide resin (A). Consequently, it is possible to impart more excellent heat resistance, resistance to soldering heat, and PCT resistance to the resulting thermosetting resin composition.

The diamine having the hydroxyl group and/or the carboxyl group is not particularly limited as long as the diamine includes at least one of the hydroxyl group and the carboxyl group. Specific examples thereof include diaminophenols, such as 2,4-diaminophenol; hydroxybiphenyl compounds, such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; hydroxydiphenylalkanes, such as 3,3'-diamino-4,4'-dihydroxydiphenylmethane, 4,4'-diamino-3,3'-dihydroxydiphenylmethane, 4,4'-diamino-2,2'-dihydroxydiphenylmethane, 2,2-bis[3-amino-4-hydroxyphenyl]propane, 2,2-bis[4-amino-3-hydroxyphenyl]propane, 2,2-bis[3-amino-4-hydroxyphenyl]hexafluoropropane, and 4,4'-diamino-2,2',5,5'-tetrahydroxydiphenylmethane; hydroxydiphenyl ether compounds, such as 3,3'-diamino-4,4'-dihydroxydiphenyl ether, 4,4'-diamino-3,3'-dihydroxydiphenyl ether, 4,4'-diamino-2,2'-dihydroxydiphenyl ether, and 4,4'-diamino-2,2',5,5'-tetrahydroxydiphenyl ether; diphenyl sulfone compounds, such as 3,3'-diamino-4,4'-dihydroxydiphenyl sulfone, 4,4'-diamino-3,3'-dihydroxydiphenyl sulfone, 4,4'-diamino-2,2'-dihydroxydiphenyl sulfone, and 4,4'-diamino-2,2',5,5'-tetrahydroxydiphenyl sulfone; bis[(hydroxyphenoxy)phenyl]alkane compounds, such as 2,2-bis[4-(4-amino-3-hydroxyphenoxy)phenyl]propane; bis(hydroxyphenoxy)biphenyl compounds, such as 4,4'-bis(4-amino-3-hydroxyphenoxy)biphenyl; bis[(hydroxyphenoxy)phenyl]sulfone compounds, such as 2,2-bis[4-(4-amino-3-hydroxyphenoxy)phenyl]sulfone; diaminobenzoic acids, such as 3,5-diaminobenzoic acid; carboxybiphenyl compounds, such as 3,3'-diamino-4,4'-dicarboxybiphenyl, 4,4'-diamino-3,3'-dicarboxybiphenyl, 4,4'-diamino-2,2'-dicarboxybiphenyl, and 4,4'-diamino-2,2',5,5'-tetracarboxybiphenyl; carboxydiphenylalkanes, such as 3,3'-diamino-4,4'-dicarboxydiphenylmethane, 4,4'-diamino-3,3'-dicarboxydiphenylmethane, 4,4'-diamino-2,2'-dicarboxydiphenylmethane, 2,2-bis[4-amino-3-carboxyphenyl]propane, 2,2-bis[3-amino-4-carboxyphenyl]hexafluoropropane, and 4,4'-diamino-2,2,5,5'-tetracarboxydiphenylmethane; carboxydiphenyl ether compounds, such as 3,3'-diamino-4,4'-dicarboxydiphenyl ether, 4,4'-diamino-3,3'-dicarboxydiphenyl ether, 4,4'-diamino-2,2'-dicarboxydiphenyl ether, and 4,4'-diamino-2,2',5,5'-tetracarboxydiphenyl ether; diphenyl sulfone compounds, such as 3,3'-diamino-4,4'-dicarboxydiphenyl sulfone, 4,4'-diamino-3,3'-dicarboxydiphenyl sulfone, 4,4'-diamino-2,2-dicarboxydiphenyl sulfone, and 4,4'-diamino-2,2',5,5'-tetracarboxydiphenyl sulfone; bis[(carboxyphenoxy)phenyl]alkane compounds, such as 2,2-bis[4-(4-amino-3-carboxyphenoxy)phenyl]propane; bis(hydroxyphenyl)alkanes, such as 2,2-bis(3-amino-4-hydroxyphenyl)hexafluoropropane; bis(hydroxyphenoxy)biphenyl compounds, such as 4,4'-bis(4-amino-3-hydroxyphenoxy)biphenyl; and bis[(carboxyphenoxy)phenyl]sulfone compounds, such as 2,2-bis[4-(4-amino-3-carboxyphenoxy)phenyl]sulfone.

Among the diamines having the hydroxyl group and/or the carboxyl group described above, use of 3,3'-dihydroxy-4,4'-diaminobiphenyl represented by the following formula:

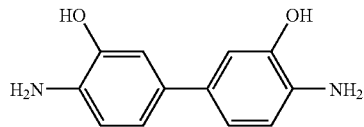 [SMILES: Nc1ccc(-c2ccc(N)c(O)c2)cc1O]

is particularly preferable so that satisfactory resistance to soldering heat and PCT resistance are obtained.

When the polyimide resin (A) is synthesized, as the diamine component, preferably, at least one aromatic diamine represented by general formula (8) and/or at least one diamine having the hydroxyl group and/or carboxyl group are used. More preferably, both diamines are used. Furthermore, when the 3,3'-dihydroxy-4,4'-diaminobiphenyl described above is used as the diamine having the hydroxyl group and/or carboxyl group, it is possible to impart excellent resistance to soldering heat and resistance to humidity test using a pressure cooker (PCT) to the resulting thermosetting resin composition.

In the present invention, as the diamine component, in addition to the aromatic diamine and/or the diamine having the hydroxyl group and/or the carboxyl group, other diamine may be used. Herein, the other diamine can be appropriately selected depending on the application and required physical properties of the target polyimide resin (A) or the thermosetting resin composition, and the other diamine is not particularly limited to specific compounds.

Examples of the other diamine include, but are not limited to, 3,3'-diamino ether, m-phenylenediamine, o-phenylenediamine, p-phenylenediamine, m-aminobenzylamine, p-aminobenzylamine, bis(3-aminophenyl) sulfide, (3-aminophenyl)(4-aminophenyl) sulfide, bis(4-aminophenyl) sulfide, bis(3-aminophenyl) sulfoxide, (3-aminophenyl)(4-aminophenyl) sulfoxide, bis(3-aminophenyl) sulfone, (3-aminophenyl)(4-aminophenyl) sulfone, bis(4-aminophenyl) sulfone, 3,4'-diaminobenzophenone, 4,4'-diaminobenzophenone, 3,3'-diaminodiphenylmethane, 3,4'-diaminodiphenylmethane, 4,4'-diaminodiphenylmethane, 4,4'-diaminodiphenyl ether, 3,3'-diaminodiphenyl ether, 3,4'-diaminodiphenyl ether, bis[4-(3-aminophenoxy)phenyl]sulfoxide, bis[4-(aminophenoxy)phenyl]sulfoxide, 4,4'-diaminodiphenylmethane, 3,3'-dimethyl-4,4'-diaminodiphenylmethane, 3,3',5,5'-tetramethyl-4,4'-diaminodiphenylmethane, 3,3',5,5'-tetraethyl-4,4'-diaminodiphenylmethane, 3,3'-dimethyl-5,5'-diethyl-4,4'-diaminodiphenylmethane, 4,4'-methylenebis(cyclohexylamine), 3,3'-dimethyl-4,4'-diaminodicyclohexylmethane, 3,3'-dimethoxy-4,4'-diaminodiphenylmethane, 3,3'-diethoxy-4,4'-diaminodiphenylmethane, bis(3-aminophenyl)ether, bis(4-aminophenyl)ether, 3,3'-diethyl-4,4'-diaminodiphenyl ether, 3,3'-dimethoxy-4,4'-diaminodiphenyl ether, 3,3'-dimethyl-4,4'-diaminodiphenyl sulfone, 3,3'-diethyl-4,4'-diaminodiphenyl sulfone, 3,3'-dimethoxy-4,4'-diaminodiphenyl sulfone, 3,3'-diethoxy-4,4'-diaminodiphenyl sulfone, 3,3'-dimethyl-4,4'-diaminodiphenylpropane, 3,3'-diethyl-4,4'-diaminodiphenylpropane, 3,3'-dimethoxy-4,4'-diaminodiphenylpropane, 3,3'-diethoxy-4,4'-diaminodiphenylpropane, 1,3-bis(4-aminophenyl)propane, 2,2-bis(4-aminophenyl)propane, 4,4'-diaminodiphenyl sulfide, 3,3'-dimethyl-4,4'-diaminodiphenyl sulfide, 3,3'-diethyl-4,4'-diaminodiphenyl sulfide, 3,3'-dimethoxy-4,4'-diaminodiphenyl sulfide, 3,3'-diethoxy-4,4'-diaminodiphenyl sulfide, 2,2'-diaminodiethyl sulfide, 2,4'-diaminodiphenyl sulfide, 1,2-bis(4-aminophenyl)ethane, 1,1-bis(4-aminophenyl)ethane, o-toluidine sulfone, bis(4-aminophenyl)diethylsilane, bis(4-aminophenyl)ethylphosphine oxide, bis(4-aminophenyl)-N-methylamine, 1,2-diaminonaphthalene, 1,4-diaminonaphthalene, 1,5-diaminonaphthalene, 1,6-diaminonaphthalene, 1,7-diaminonaphthalene, 1,8-diaminonaphthalene, 2,3-diaminonaphthalene, 2,6-diaminonaphthalene, 1,4-diamino-2-methylnaphthalene, 1,5-diamino-2-methylnaphthalene, 1,3-diamino-2-phenylnaphthalene, 9,9-bis(4-aminophenyl)fluorene, 4,4'-diaminobiphenyl, 3,3'-diaminobiphenyl, 3,3'-dichloro-4,4'-diaminobiphenyl, 3,3'-dimethyl-4,4'-diaminobiphenyl, 3,4'-dimethyl-4,4'-diaminobiphenyl, 3,3'-dimethoxy-4,4'-diaminobiphenyl, 2,4-diaminotoluene, 2,5-diaminotoluene, 2,6-diaminotoluene, 3,5-diaminotoluene, 1,3-diamino-2,5-dichlorobenzene, 1,4-diamino-2,5-dichlorobenzene, 1-methoxy-2,4-diaminobenzene, 1,3-diamino-4,6-dimethylbenzene, 1,4-diamino-2,5-dimethylbenzene, 1,4-diamino-2-methoxy-5-methylbenzene, 1,4-diamino-2,3,5,6-tetramethylbenzene, 1,4-bis(2-methoxy-4-aminopentyl)benzene, 1,4-bis(1,1-dimethyl-5-aminopentyl)benzene, o-xylenediamine, m-xylenediamine, p-xylenediamine, 9,10-bis(4-aminophenyl)anthracene, 3,3'-diaminobenzophenone, 2,6-diaminopyridine, 3,5-diaminopyridine, 1,3-diaminoadamantane, 3,3'-diamino-1,1,1'-diadamantane, N-(3-aminophenyl)-4-aminobenzamide, 4,4'-diaminobenzanilide, 4-aminophenyl-3-aminobenzoate, 2,2-bis(4-aminophenyl)hexafluoropropane, 2,2-bis(3-aminophenyl)hexafluoropropane, 2-(3-aminophenyl)-2-(4-aminophenyl)hexafluoropropane, 2,2-bis[4-(2-chloro-4-aminophenoxy)phenyl]hexafluoropropane, 1,1-bis(4-aminophenyl)-1-phenyl-2,2,2-trifluoroethane, 1,1-bis[4-(4-aminophenoxy)phenyl]-1-phenyl-2,2,2-trifluoroethane, 1,3-bis(3-aminophenyl)hexafluoropropane, 1,3-bis(3-aminophenyl)decafluoropropane, 2,2-bis(3-amino-4-methylphenyl)hexafluoropropane, 2,2-bis(5-amino-4-methylphenyl)hexafluoropropane, and 1,4-bis(3-aminophenyl)but-1-en-3-yne. These compounds may be used alone or two or more of these may be combined appropriately.

Additionally, among the other diamines described above (or the diamines having the hydroxyl group and/or the carboxyl group) used in the present invention, depending on the application, a diamine containing a siloxane bond (—Si—O—) (for the convenience of description, referred to as a "siloxane diamine") may be preferably used.

Examples of the siloxane diamine include a compound represented by general formula (10):

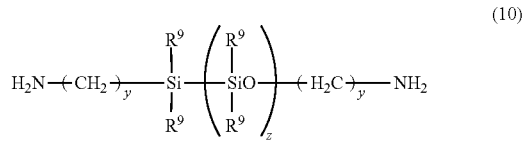

(wherein each $R^9$ represents an alkyl group having 1 to 12 carbon atoms or a phenyl group; each y represents an integer of 1 to 40; and z represents an integer of 1 to 20). If such a siloxane diamine is used, in the resulting polyimide resin (A), solubility in organic solvents can be improved.

Furthermore, besides the siloxane diamine, examples of the other diamine which may be preferably used in the present invention include isophorone diamine, hexamethylenediamine, and diaminodicyclohexylmethane. If any of these diamines is used, in the resulting polyimide resin (A), solubility in organic solvents and heat resistance can be further improved.

The diamine component used in the present invention preferably contains at least the diamine represented by general formula (8), and particularly preferably further contains the diamine having the hydroxyl group and/or the carboxyl group. By specifying the contents of the individual diamines in the total diamine component, it is possible to produce a polyimide resin (A) having excellent physical properties.

Specifically, preferably, the diamine represented by general formula (8) is used in an amount of 60 to 90 mole percent and the diamine having the hydroxyl group and/or the carboxyl group is used in an amount of 1 to 40 mole percent based on 100 mole percent of the total diamine component used as the starting material. If the contents of the individual diamines are in the ranges described above, it is possible to avoid the situation in which the solubility, resistance to soldering head, and PCT resistance of the resulting polyimide resin (A) are impaired.

Furthermore, although the content of the other diamine in the total diamine component is not particularly limited, the other diamine is preferably used in an amount of less than 10 mole percent based on 100 mole percent of the total diamine component used as the starting material.

<Isocyanate Component>

As described above, the polyimide resin (A) used in the present invention may be produced by reacting an acid dianhydride component with a diamine component or an isocyanate component. Consequently, in the present invention, instead of the diamine component, an isocyanate component can be used as a starting material.

As the isocyanate component used in the present invention, any isocyanate can be used as long as the isocyanate is capable of producing the polyimide resin (A) in which excellent solubility in various types of organic solvent, heat resistance, resistance to soldering heat, PCT resistance, low water absorption, and thermoplasticity are exhibited. Specific examples of the isocyanate include diisocyanates corresponding to the diamines described above.

More specifically, examples of the isocyanate include, but are not limited to, diisocyanates corresponding to the aromatic diamines represented by general formula (8) and the aromatic diamines having amino groups at the meta positions or the ortho positions [e.g., a diisocyanate corresponding to 1,3-bis(3-aminophenoxy)benzene]; diisocyanates corresponding to diamines having the hydroxyl group and/or the carboxyl group [e.g., a diisocyanate corresponding to 3,3'-dihydroxy-4,4'-diaminobiphenyl]; diisocyanates corresponding to siloxane diamines; and diisocyanates corresponding to isophorone diamine, hexamethylenediamine, diaminodicyclohexylmethane, and the like. These compounds may be used alone or in combination of two or more.

<Structure that can be Introduced Other than Imide Ring>

Examples of the polyimide resin (A) used in the present invention include both polyimide resins in a narrow sense and polyimide resins in a broad sense having repeating units other than imide rings, such as polyamideimides, polyesterimides, and polyetherimides. In this way, a structure other than the imide ring may be introduced into the polyimide resin (A).

A polyamideimide can be synthesized using trimellitic anhydride as an acid dianhydride component and an aromatic group-containing diamine or isocyanate as a diamine component or isocyanate component.

Next, a polyesterimide can be synthesized using trimellitic anhydride as an acid dianhydride component and the diamine component described above. Specifically, first, by reaction of trimellitic anhydride with the diamine component, an imide ring-containing dicarboxylic-acid represented by general formula (11):

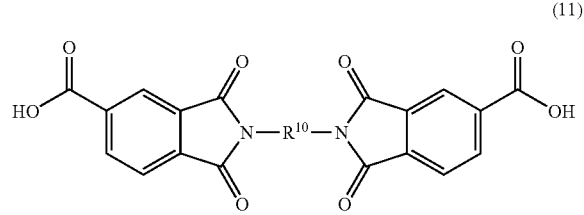

(wherein $R^{10}$ represents a divalent organic group) is synthesized. Subsequently, the dicarboxylic acid is reacted with the other acid dianhydride which will be described below and a diol, and dehydrocondensation is carried out. A polyesterimide is thereby produced.

Next, a polyetherimide is produced using an ether bond-containing compound as at least one of the acid dianhydride component and the diamine component.

Herein, the trimellitic anhydride used as the acid dianhydride component in the polyamideimide or the polyesterimide can be copolymerized with other acid dianhydride. Examples of the other acid dianhydride include, but are not limited to, aliphatic or alicyclic dicarboxylic acids, such as oxalic acid, malonic acid, succinic acid, adipic acid, sebacic acid, azelaic acid, dodecanedioic acid, cyclohexanedicarboxylic acid, maleic acid, maleic anhydride, itaconic acid, itaconic anhydride, dimer acids, and hydrogenated dimer acids; aromatic dicarboxylic acids, such as terephthalic acid, isophthalic acid, naphthalenedicarboxylic acid, diphenylmethane-4,4-dicarboxylic acid, diphenylether-4,4-dicarboxylic acid, bis[(4-carboxy)phthalimide]-4,4-diphenyl ether, bis[(4-carboxy)phthalimide]-a,a'-metaxylene, and 5-hydroxyisophthalic acid; tricarboxylic acids, such as butane-1,2,4-tricarboxylic acid and naphthalene-1,2,4-tricarboxylic acid, and dianhydrides thereof; and tetracarboxylic acids, such as pyromellitic acid, benzophenonetetracarboxylic acid, benzene-1,2,3,4-tetracarboxylic acid, biphenyltetracarboxylic acid, naphthalenetetracarboxylic acid, perylene-3,4,9,10-tetracarboxylic acid, ethylene glycol bis(anhydrotrimellitate), propylene glycol bis(anhydrotrimellitate), and 3,3',4'-oxydiphthalic acid, and dianhydrides thereof. These compound may be used alone or two or more of these may be combined appropriately.

Moreover, in order to further improve solubility in an organic solvent with respect to the resulting polyimide resin (A), for example, an aliphatic compound component, an alicyclic compound component, an alkylene oxide adduct of a bisphenol compound, or the like may be introduced into the polyimide resin (A).

Among these, with respect to the aliphatic compound component and the alicyclic compound component, if an aliphatic or alicyclic compound is selected as the acid dianhydride component, the diamine component, or the isocyanate component, it is possible to introduce the aliphatic compound component or the alicyclic compound component into the backbone of the polyimide resin (A). Specific examples of the aliphatic or alicyclic compound include, but are not limited to, dimer acids, hydrogenated dimer acids, isophorone diamine, hexamethylenediamine, diaminodicyclohexylmethane, and isocyanates corresponding thereto.

Furthermore, examples of the alkylene oxide adduct of the bisphenol compound include ethylene oxide adducts and propylene oxide adducts of bisphenol A, bisphenol F, bisphenol S, and biphenols. In these compounds, the amount of the alkylene oxide to be added is not particularly limited. However, from the standpoint of the thermal stability of the resulting polyimide resin (A), the amount of the alkylene oxide to be added to one end is 5 moles or less, preferably 3 moles or less, and more preferably 2 moles or less, on an average.

When the aliphatic compound component, the alicyclic compound component, or the alkylene oxide adduct of the bisphenol compound is introduced into the polyimide resin (A), this component tends to have a high effect of improving solubility and a low effect of decreasing heat resistance. Consequently, when this component is introduced, the amount of introduction is set in a range of 1 to 100 mole percent based on the total amount of the acid dianhydride component or the total amount of the diamine component or the isocyanate component. Thereby, in the resulting polyimide resin (A), solubility in organic solvents, in particular, aromatic, ketone, or ether solvents, can be improved.

<Synthesis of Polyimide Resin (A)>

The polyimide resin (A) used in the present invention can be produced by a known method. Specifically, depending on the starting materials used, the synthesis methods (production methods) of the polyimide resin (A) can be broadly divided into the following two methods.

In a first method, as starting materials (monomer components), an acid dianhydride component and a diamine component are used. These monomer components are subjected to polycondensation to synthesize a polyamic acid, which is a precursor, and the polyamic acid is chemically or thermally cyclodehydrated (imidized). Thus, the first method is performed in two stages. On the other hand, in a second method, as starting materials, an acid dianhydride component and an isocyanate component are used. These monomer components are polymerized to produce a polyimide resin. Thus, the second method is a one-stage method.

Synthesis (production) of a polyamic acid and imidization of the polyamic acid in the first method and the second method will be described in detail in that order below.

<Synthesis (Production) Process for Polyamic Acid in First Method>

In the synthesis (production) process for polyamic acid, an acid dianhydride component containing at least one acid dianhydride and a diamine component containing at least one diamine are reacted with each other in an organic solvent. In this process, substantially equimolar amounts of the acid dianhydride component and the diamine component are reacted with each other. Consequently, when only one acid dianhydride and one diamine are used, these are mixed in equimolar amounts. When two or more acid dianhydrides and two or more diamines are used, the total amount of the acid dianhydride component (total amount of a plurality of acid dianhydrides) and the total amount of the diamine component (total amount of a plurality of diamines) are adjusted to be equimolar. When a plurality of acid dianhydrides and diamines are used, a polyamic acid copolymer can be prepared in any manner.

In the synthesis of the polyamic acid, the method for reacting the individual monomer components are not particularly limited. In general, a method is used in which substantially equimolar amounts of the acid dianhydride component and the diamine component are dissolved in an organic solvent, and then stirring is performed under controlled reaction conditions until polymerization is completed. By this method, it is possible to prepare a solution in which the polyamic acid is dissolved in the organic solvent (hereinafter referred to as a "polyamic acid solution").

With respect to the order of addition of the acid dianhydride component and the diamine component, examples of the method include, but are not limited to, (1) a method in which a diamine component is dissolved in an organic solvent, and then an acid dianhydride component is added thereto; (2) a method in which an acid dianhydride component is dissolved in an organic solvent, and then a diamine component is added thereto; and (3) a method in which an adequate amount of a diamine component is added and dissolved in an organic solvent, an acid dianhydride component is added thereto in excess of the diamine component, and then the diamine component is added in an amount corresponding to the excess amount of the added acid dianhydride component. Herein, the term "dissolved" means not only a state in which a solvent completely dissolves a solute but also a state in which a solute is uniformly dispersed or diffused in a solvent and which is substantially the same as the dissolved state.

In the synthesis reaction of the polyamic acid, synthesis conditions are not particularly limited as long as the conditions allow the monomer components to be polymerized to synthesize a polyamic acid satisfactorily. In the present invention, among the synthesis conditions, the temperature conditions, the reaction time, and the organic solvent used are preferably defined as follows:

The temperature range for the synthesis reaction of the polyamic acid is not particularly limited as long as the acid dianhydride component and the diamine component can be polymerized. The upper limit is preferably 80° C. or less, more preferably 50° C. or less, and still more preferably 30° C. or less, and particularly preferably 20° C. or less. The lower limit is not particularly limited, but is preferably higher than or equal to the temperature that allows the reaction to proceed and prevents the precipitation of the polymer produced by the reaction. Specifically, although depending on the starting materials used for the polymerization, the lower limit is preferably −20° C. or more, and particularly preferably 0° C. or more.

Furthermore, the reaction time in the synthesis reaction for the polyamic acid is not particularly limited as long as the time allows the polymerization reaction between the acid dianhydride component and the diamine component to be completed. The upper limit is generally sufficient at 50 hours and may be 12 hours or less. On the other hand, the lower limit is preferably 30 minutes or more, and more preferably 3 hours or more.

In the synthesis reaction of the polyamic acid, any organic solvent capable of dissolving the polyamic acid sufficiently can be used without limitation. Usually, a polar organic solvent is used. Furthermore, from the standpoints that an increase in viscosity is prevented to facilitate stirring during the synthesis of the polyamic acid and that the resulting polyimide resin (A) is easily dried, and the like, preferably, a polar organic solvent that can dissolve the polyamic acid satisfactorily and that has a boiling point as low as possible is selected. Thereby, the production process of the polyimide resin (A) can be performed more efficiently.

Examples of the polar organic solvent which may be used in the synthesis reaction of the polyamic acid include, but are not limited to, sulfoxide solvents, such as N,N-dimethyl sulfoxide and diethyl sulfoxide; formamide solvents, such as N,N-dimethylformamide and N,N-diethylformamide; acetamide solvents, such as N,N-dimethylacetamide and N,N-diethylacetamide; pyrrolidone solvents, such as N-methyl-2-pyrrolidone and N-vinyl-2-pyrrolidone; phenol solvents, such as phenol, o-cresol, m-cresol, p-cresol, xylenol, halogenated phenol, and catechol; hexamethylphosphamide; and γ-butyrolactone.

These polar organic solvents may be used alone or two or more of these may be combined appropriately. Furthermore, as necessary, any of the polar organic solvents and an aromatic hydrocarbon, such as xylene or toluene, may be combined for use.

Specific conditions of the polyamic acid solution obtained by the synthesis method described above are not particularly limited. The logarithmic viscosity number is preferably set in the following range. That is, in a 100 ml of N-methyl-2-pyrrolidone solution containing 0.5 g of polyamic acid, the logarithmic viscosity number at 30° C. is preferably in a range of 0.2 to 4.0 dl/g, and more preferably in a range of 0.3 to 2.0 dl/g.

<Imidization of Polyamic Acid in First Method>

The polyimide resin (A) used in the present invention is produced by imidization of the polyamic acid obtained by the synthesis method described above. The specific method of imidization is not particularly limited. For example, the polyamic acid in the polyamic acid solution is cyclodehydrated by a thermal method or a chemical method. Herein, the term "thermal method" means a method in which a polyamic acid solution is dehydrated by heat treatment, and the term "chemical method" means a method in which dehydration is performed using a dehydrating agent. Other than these methods, a method in which imidization is carried out by heat treatment under reduced pressure may be used.

(1) Thermal Method

The thermal method is not particularly limited as long as the polyamic acid is cyclodehydrated by heating. For example, in a specific method, imidization is allowed to proceed by heat treatment of the polyamic acid solution and at the same time the solvent is evaporated, etc. The heat treatment conditions are not particularly limited. Preferably, the heating temperature is 300° C. or less and the heating time is in a range of about 5 minutes to 10 hours. Furthermore, a thermal cyclization process by means of reflux of toluene, xylene, or the like may also be used. By such a thermal method, a polyimide resin (A) can be obtained.

(2) Chemical method

With respect to the chemical method, for example, in a method, by adding stoichiometric amounts or more of a dehydrating agent and a catalyst to the polyamic acid solution, dehydration reaction and evaporation of the solvent are performed. By such a chemical method, a polyimide resin (A) can be obtained.

Specific examples of the dehydrating agent include aliphatic acid anhydrides, such as acetic anhydride; aromatic acid anhydrides, such as benzoic anhydride; and carbodiimides, such as N,N'-dicyclohexylcarbodiimide and N,N'-diisopropylcarbodiimide. Furthermore, specific examples of the catalyst include aliphatic tertiary amines, such as triethylamine; aromatic tertiary amines, such as dimethylaniline; and heterocyclic tertiary amines, such as pyridine, α-picoline, β-picoline, γ-picoline, and isoquinoline.

The conditions for the chemical method are not particularly limited. Preferably, the reaction temperature is 100° C. or less, and the reaction time is in a range of about one minute to 50 hours. Although the conditions for the evaporation of the organic solvent are also not particularly limited, the heating temperature is preferably 200° C. or less, and the heating time is in a range of about 5 minutes to 12 hours.

(3) Heating Treatment Under Reduced Pressure

One of the methods other than the thermal method and the chemical method is a method (for the convenience of description, referred to as a "reduced-pressure heating method") in which imidization is carried out by heat treatment under reduced pressure. By the reduced-pressure heating method, it is also possible to produce the polyimide resin (A). The treatment conditions in the reduced-pressure heating method are not particularly limited as long as imidization is allowed to take place. Among the treatment conditions, the heating conditions and the pressure conditions are preferably set as described below.

First, with respect to the heating conditions, the heating temperature is set in a range of 80° C. to 400° C. In order to perform imidization and dehydration efficiently, the lower limit is set preferably at 100° C. or more, and more preferably at 120° C. or more. On the other hand, the maximum temperature (upper limit) in the heating treatment is preferably set to be lower than the thermal decomposition temperature of the resulting polyimide resin (A). Consequently, the upper limit of the heating temperature is preferably set in a range of about 180° C. to 350° C., which usually corresponds to the completion temperature for imidization.

Next, the pressure conditions are not particularly limited as long as the pressure is low. Specifically, the pressure is preferably in a range of 0.001 to 0.9 atm, more preferably in a range of 0.001 to 0.8 atm, and most preferably in a range of 0.001 to 0.7 atm. In other words, the upper limit of the pressure in the reduced-pressure heating method is less than 1 atm, preferably 0.9 atm or less, more preferably 0.8 atm or less, and most preferably 0.7 atm or less. On the other hand, the lower limit is 0.001 atm or more, although not limited thereto.

In the process in which the polyamic acid is imidized by the reduced-pressure heating method, water generated during imidization can be actively removed out of the system. Therefore, it is possible to inhibit hydrolysis of the polyamic acid. Furthermore, the acid dianhydride component, which is a starting material of the polyamic acid, contains compounds having an open-circular form at one end or compounds having an open-circular form at both ends, these compounds being impurities. By employing the reduced-pressure heating method, it is possible to cyclize the compounds having an open-circular form at one end or the compounds having an open-circular form at both ends. As a result, the molecular weight of the resulting polyimide resin (A) can be further increased.

(4) Solidification Method in which Solvent is not Evaporated

In the thermal method, the chemical method, or the reduced-pressure heating method described above, the solvent is evaporated in the imidization process. However, a thermal method or a chemical method in which the solvent is not evaporated and a solid polyimide resin (A) is obtained is also available. Specifically, in this method, the solution of the polyimide resin (A) prepared by the thermal method or the chemical method is added to a poor solvent to precipitate the polyimide resin, and drying is performed. Thereby, a solid polyimide resin (A) is obtained.

As the poor solvent, any solvent that mixes satisfactorily with a solvent of the solution of the resulting polyimide resin (A) but does not easily dissolve the polyimide resin (A) can be used without limitation in this method. Specific examples thereof include acetone, methanol, ethanol, isopropanol, benzene, Methyl Cellosolve (registered trademark), methyl ethyl ketone, and water.

In this method, since the polyimide resin (A) is precipitated in the poor solvent, the solid polyimide resin (A) is obtained, and it is also possible to perform purification by removing impurities. Examples of the impurities include unreacted monomer components (acid dianhydrides and diamines); acetic anhydride and pyridine (in the case of the chemical method); and toluene and xylene (in the case of the thermal method). In the precipitation method using a poor solvent, purification and drying can be carried out while removing the impurities. Consequently, it is possible to improve the quality of the resulting polyimide resin (A).

<Second Method>

In the second method for synthesis (production) of the polyimide resin (A), an acid dianhydride component containing at least one acid dianhydride and an isocyanate component containing at least one diisocyanate are reacted with each other in an organic solvent. In this process, as in the synthesis of the polyamic acid in the first method, substantially equimolar amounts of the acid dianhydride component and the isocyanate component are mixed.

In the second method, the process for reaction of the individual monomer components is not particularly limited. In general, as in the synthesis of the polyamic acid described above, a process is used in which substantially equimolar amounts of the acid dianhydride component and the isocyanate component are dissolved in an organic solvent, and then stirring is performed under controlled reaction conditions until polymerization is completed. By this process, it is possible to produce a solution in which a polyimide is dissolved in an organic solvent (soluble polyimide solution) in one stage.

Although the reaction of the individual monomer components may be performed in the absence of a catalyst, it is preferable to use a catalyst that catalyzes the reaction of the isocyanate component with the active hydrogen compound. Examples of the catalyst include tertiary amines, alkali metal compounds, alkaline-earth metal compounds, metals, such as cobalt, titanium, tin, and zinc, and semimetallic compounds. In the second method, the order of addition of the acid dianhydride component and the isocyanate component is not particularly limited and may be selected according to the synthesis method of the polyamic acid described above.

In the second method, the synthesis conditions for synthesizing the polyimide resin (A) are not particularly limited as long as a polyimide is sufficiently synthesized by polymerization of the monomer components. In the present invention, among the synthesis conditions, the temperature conditions and the organic solvent used are preferably defined as described below.

The temperature range for the synthesis reaction in the second method is not particularly limited as long as the acid dianhydride component and the isocyanate component can be polymerized. Usually, the temperature is preferably in a range of 50° C. to 220° C. Additionally, the reaction time is not particularly limited.

In the synthesis reaction of the second method, any solvent capable of dissolving the resulting polyimide resin (A) sufficiently can be used without limitation. As in the synthesis of the polyamic acid described above, from the standpoints that an increase in viscosity is prevented to facilitate stirring during the synthesis and that the resulting polyimide resin (A) is easily dried, and the like, preferably, an organic solvent that can dissolve the polyimide satisfactorily and that has a boiling point as low as possible is selected. Thereby, the production process of the polyimide resin (A) can be performed more efficiently.

Examples of the organic solvent which may be used in the synthesis reaction of the second method include, but are not limited to, amide-based organic solvents, such as N,N-dimethylformamide, N,N-dimethylacetamide, N,N-diethylacetamide, N,N-dimethylmethoxyacetamide, N-methyl-2-pyrrolidone, and hexamethylphosphamide; lactam-based organic solvents, such as N-methylcaprolactam; urea-based organic solvents, such as 1,3-dimethyl-2-imidazolidinone and tetramethylurea; hydrocarbon-based organic solvents, such as 1,2-dimethoxyethane, 1,2-bis(2-methoxyethyl)ethane, and bis[2-(2-methoxyethoxy)ethane]; ether-based organic solvents, such as bis(2-methoxyethyl)ether, bis[2-(2-methoxyethoxy)ethyl]ether, 1,3-dioxane, 1,4-dioxane, tetrahydrofuran, and diglyme; ester-based organic solvents, such as γ-butyrolactone; pyridine-based organic solvents, such as pyridine and picoline; sulfur-based organic solvents, such as dimethyl sulfoxide, dimethyl sulfone, and sulfolane; nitro-based organic solvents, such as nitromethane, nitroethane, and nitrobenzene; and nitrile-based organic solvents, such as acetonitrile. These organic solvents may be used alone or two or more of these may be combined appropriately.

<Soluble Polyimide Solution>

In the preparation of the thermosetting resin composition of the present invention, the resulting polyimide resin (A) may be dissolved in a desired organic solvent to prepare a soluble polyimide solution usable in the preparation. The organic solvent used for the soluble polyimide solution is not particularly limited as long as the solvent can dissolve the resulting polyimide resin (A). Examples of the organic solvent include the polar organic solvents used in the synthesis reaction of the polyamic acid described above. These organic solvents may be used alone or two or more of these may be combined appropriately.

The concentration of the soluble polyimide solution is not particularly limited and may be determined appropriately depending on the application (intended use), method of use, etc. of the thermosetting resin composition. Usually, the concentration is in a range of 1 to 30% by weight. The viscosity of the soluble polyimide solution is not particularly limited. Usually, in an N-methyl-2-pyrrolidone solution containing the soluble polyimide, the logarithmic viscosity number at 30° C. is preferably in a range of 0.1 to 2.5 dl/g. If the logarithmic viscosity number is within this range, the molecular weight of the polyimide resin (A) can generally be set at a suitable value.

The thermosetting resin composition of the present invention contains at least one of the polyimide resins (A) described above as the polyimide-based resin (A). The thermosetting resin composition may contain two or more polyimide resins (A) or may contain a polyimide resin other than the polyimide resins (A). Furthermore, as the polyimide resin (A), a polyamic acid, which is a precursor before imidization, may be used. Use of the imidized polyimide resin (A) instead of polyamic acid is preferable because reactions do not easily occur during mixing of the individual components and stability is high when the thermosetting resin composition is prepared.

(B) Phenol Resin

The phenol resin contained in the thermosetting resin composition according to the first embodiment of the present invention will now be described. Incorporation of the phenol resin component (B) containing at least one phenol resin into the thermosetting resin composition of the present invention imparts plasticity to the thermosetting resin composition and also imparts heat resistance to a cured resin obtained by curing the thermosetting resin composition. Furthermore, the phenol resin enables the epoxy resin component (C), which will be described below, to be cured efficiently when the thermosetting resin composition is cured.

The phenol resin is not particularly limited. Examples thereof include phenol novolac-type phenol resins, cresol novolac-type phenol resins, bisphenol A novolac-type phenol resins, biphenol cresol novolac-type phenol resins, cresol/melamine copolymer-type phenol resins, and naphthol/cresol copolymer-type phenol resins. Among the phenol resins described above, a phenol resin having at least one aromatic ring and/or aliphatic ring in its molecular chain is preferably used. Thereby, it is possible to obtain compatibility with the polyimide resin component (A) and the epoxy resin component (C). It is also possible to impart excellent heat resistance to a cured resin obtained by curing the thermosetting resin composition.

As the phenol resin having at least one aromatic ring and/or aliphatic ring in its molecular chain, particularly preferred is at least one phenol resin selected from the group consisting of compounds having structures represented by the formulae:

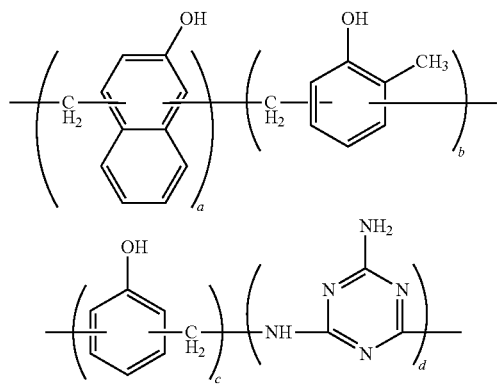

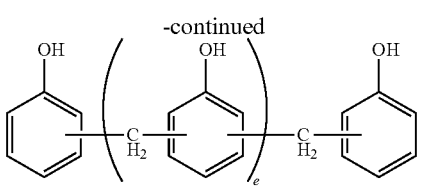

(wherein a, b, c, d, and e each represent an integer of 1 to 10).

These phenol resins may be used alone or two or more of these may be combined appropriately.

With respect to the hydroxyl value (also referred to as "hydroxyl equivalent") of the phenol resin, the lower limit is preferably 90 or more, more preferably 95 or more, and most preferably 100 or more. The upper limit of the hydroxyl value of the phenol resin is preferably 300 or less, more preferably 200 or less, and most preferably 150 or less.

If the hydroxyl value of the phenol resin becomes less than 90, the amount of the polar groups in the cured resin obtained by curing the thermosetting resin composition increases, resulting in degradation in dielectric characteristics.

That is, the dielectric constant and the dielectric loss tangent of the cured resin increase. On the other hand, if the hydroxyl value exceeds 200, the crosslinking density in the cured resin decreases, resulting in degradation in heat resistance.

(C) Epoxy Resin Component

The epoxy resin contained in the thermosetting resin composition of the present invention will now be described. Incorporation of an epoxy resin component (C) containing at least one epoxy resin into the thermosetting resin composition of the present invention imparts heat resistance and insulating properties to a cured resin obtained by curing the thermosetting resin composition and also provides adhesiveness on conductors, such as metal foils, and circuit boards.

The epoxy resin is not particularly limited. Examples thereof include epoxy resins, such as bisphenol-type epoxy resins, bisphenol A novolac-type epoxy resins, phenol novolac-type epoxy resins, alkyl phenol novolac-type epoxy resins, polyglycol-type epoxy resins, cyclic aliphatic epoxy resins, cresol novolac-type epoxy resins, glycidylamine-type epoxy resins, naphthalene-type epoxy resins, urethane-modified epoxy resins, rubber-modified epoxy resins, and epoxy-modified polysiloxanes; and halogenated epoxy resins obtained by halogenation of these epoxy resins.

Among the epoxy resins described above, an epoxy resin having at least one aromatic ring and/or aliphatic ring in its molecular chain is preferably used. Such an epoxy resin is easily available and excellent in compatibility with the polyimide resin component (A) and the phenol resin component (B), and can impart excellent heat resistance and insulating properties to the cured resin. As the epoxy resin having at least one aromatic ring and/or aliphatic ring in its molecular chain, particularly preferred is at least one epoxy resin selected from the group consisting of compounds having structures represented by the formulae:

[Chemical formula 19]

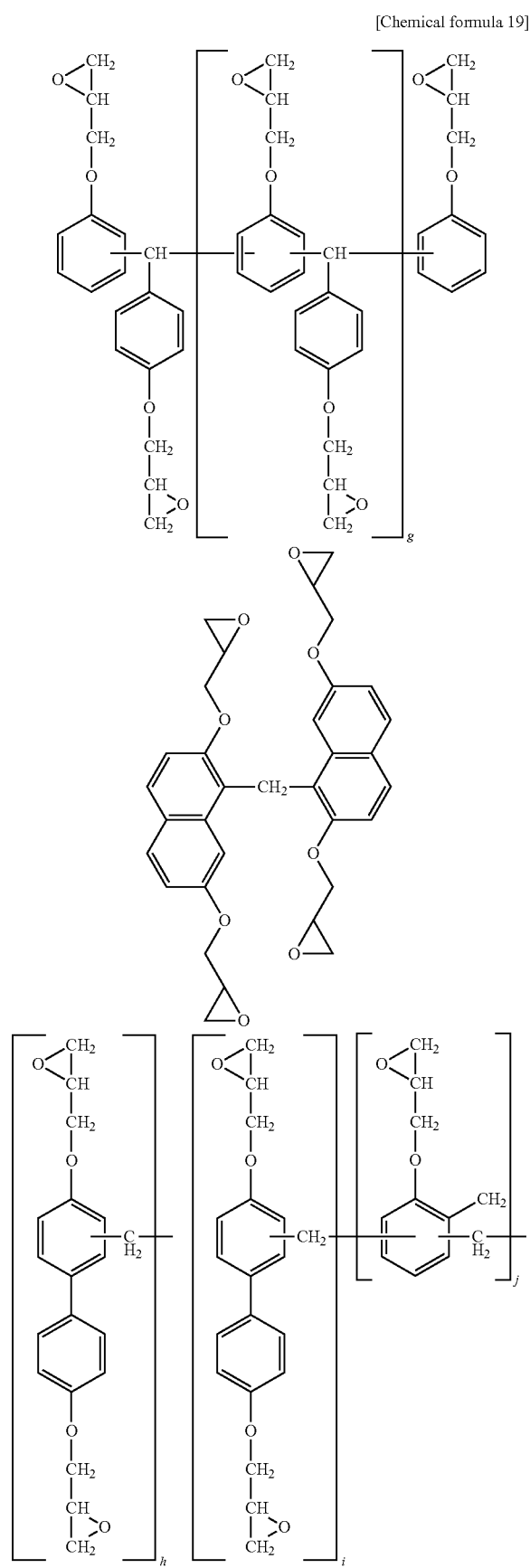
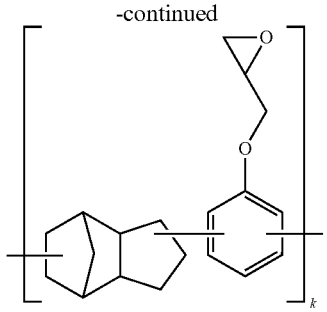

(wherein g, h, i, j, and k each represent an integer of 1 to 10).

With respect to the epoxy resin contained in the thermosetting resin composition, in order to achieve highly reliable electrical insulation, a high-purity epoxy resin is preferably used. That is, the content of halogens and alkali metals in the epoxy resin is preferably 25 ppm or less, and more preferably 15 ppm or less, when extracted at 120° C. and 2 atm. If the content of halogens and alkali metals exceeds 25 ppm, reliability of electrical insulation of a cured resin obtained by curing the thermosetting resin composition is impaired.

With respect to the epoxy value (also referred to as "epoxy equivalent") of the epoxy resin, the lower limit is preferably 150 or more, more preferably 170 or more, and most preferably 190 or more. Furthermore, the upper limit of the epoxy value of the epoxy resin is preferably 700 or less, more preferably 500 or less, and most preferably 300 or less.

If the epoxy value of the epoxy resin becomes less than 150, the amount of the polar groups in the cured resin obtained by curing the thermosetting resin composition increases, resulting in degradation in dielectric characteristics. That is, the dielectric constant and the dielectric loss tangent of the cured resin increase. On the other hand, if the epoxy value exceeds 700, the crosslinking density in the cured resin decreases, resulting in degradation in heat resistance.

(F) Other Components

The thermosetting resin composition according to the first embodiment of the present invention may contain, according to need, a curing agent (F-1) for the epoxy resin component, a curing accelerator (F-2) for accelerating the reaction of the epoxy resin component with the curing agent, and other thermosetting components, in addition to the phenol resin component (B) and the epoxy resin component (C).

(F-1) Curing Agent

The curing agent is not particularly limited. Examples thereof include aromatic diamine compounds, such as bis(4-aminophenyl) sulfone, bis(4-aminophenyl)methane, 1,5-diaminonaphthalene, p-phenylenediamine, m-phenylenediamine, o-phenylenediamine, 2,6-dichloro-1,4-benzenediamine, 1,3-di(p-aminophenyl)propane, and m-xylenediamine; aliphatic amine compounds, such as ethylenediamine, diethylenediamine, tetraethylenepentaamine, diethylaminopropylamine, hexamethylenediamine, menthane diamine, isophorone diamine, bis(4-amino-3-methyl-dicyclohexyl)methane, polymethylenediamine, and polyetherdiamine; polyaminoamide-based compounds; aliphatic acid anhydrides, such as dodecylsuccinic anhydride, poly(adipic anhydride), and poly(azelaic anhydride); alicyclic acid anhydrides, such as hexahydrophthalic anhydride and methylhexahydrophthalic acid; aromatic acid anhydrides, such as phthalic anhydride, trimellitic anhydride, benzophenonetetracarboxylic acid, ethylene glycol bistrimellitate, and glycerol tristrimellitate; amino resins; urea resins; melamine resins; dicyandiamide; dihydrazine compounds; imidazole compounds; salts of Lewis acids and Broensted acids; polymercaptan compounds; and isocyanate and blocked isocyanate compounds.

These curing agents may be used alone or in combination of two or more. The curing agent is preferably used in an amount of 1 part by weight to 100 parts by weight based on 100 parts by weight of total epoxy resin.

(F-2) Curing Accelerator

Examples of the curing accelerator include, but are not limited to, phosphine compounds, such as triphenylphosphine; amine compounds, such as tertiary amines, trimethanolamine, triethanolamine, and tetraethanolamine; borate compounds such as, 1,8-diazabicyclo[5,4,0]-7-undecenium tetraphenyl borate; imidazoles, such as imidazole, 2-ethylimidazole, 2-ethyl-4-methylimidazole, 2-phenylimidazole, 2-undecylimidazole, 1-benzyl-2-methylimidazole, 2-heptadecylimidazole, 2-isopropylimidazole, 2,4-dimethylimidazole, and 2-phenyl-4-methylimidazole; imidazolines, such as 2-methylimidazoline, 2-ethylimidazoline, 2-isopropylimidazoline, 2-phenylimidazoline, 2-undecylimidazoline, 2,4-dimethylimidazoline, and 2-phenyl-4-methylimidazoline.

These curing accelerators may be used alone or in combination of two or more. The curing accelerator is preferably used in an amount of 0.01 parts by weight to 10 parts by weight based on 100 parts by weight of total epoxy resin.

Furthermore, examples of the thermosetting component which may be used include, in order to improve various characteristics, such as adhesiveness, heat resistance, and processability, of the thermosetting resin composition or a cured resin of the thermosetting resin composition, thermosetting resins, such as bismaleimide resins, bisallylnadiimide resins, acrylic resins, methacrylic resins, curable hydrosilyl resins, curable allyl resins, and unsaturated polyester resins; and reactive side-chain group-containing thermosetting polymers having reactive groups, such as an allyl group, a vinyl group, an alkoxysilyl group, or a hydrosilyl group, in side chains or in termini of the molecular chain. These thermosetting components may be used alone or two or more of these may be combined appropriately.

Furthermore, the curing agent, the curing accelerator, and the thermosetting component are preferably incorporated into the thermosetting resin composition within such a range that the dielectric characteristics of a cured resin obtained by curing the thermosetting resin composition are not impaired.

(Second Embodiment)

A thermosetting resin composition according to a second embodiment of the present invention contains at least a polyimide resin (A) containing at least one polyimide resin, a phosphazene compound (D) containing at least one phosphazene compound, and a cyanate ester compound (E) containing at least one cyanate ester compound. The phosphazene compound (D) includes a phenolic hydroxyl group-containing phenoxyphosphazene compound (D-1) and/or a crosslinked phenoxyphosphazene compound (D-2) prepared by crosslinking the phenoxyphosphazene compound (D-1), the crosslinked phenoxyphosphazene compound (D-2) having at least one phenolic hydroxyl group.

Since the thermosetting resin composition according to the present invention contains the polyimide resin (A), it is possible to impart heat resistance to the thermosetting resin composition. Furthermore, it is possible to impart flexibility, excellent mechanical characteristics, and chemical resistance to a cured resin obtained by curing the thermosetting resin composition. It is also possible to impart excellent dielectric characteristics, i.e., a low dielectric constant and a low dielectric loss tangent in the GHz range, to the cured resin.

(A) Polyimide Resin

As the polyimide resin (A) in the second embodiment, the polyimide resin (A) described in the first embodiment can be used.

In the thermosetting resin composition according to the second embodiment of the present invention, the amount of the polyimide resin to be mixed is not particularly limited, but is preferably in the range described below. That is, the lower limit is preferably 20% by weight or more, and more preferably 30% by weight or more, based on 100% by weight of total thermosetting resin composition. On the other hand, the upper limit is preferably 80% by weight or less, and more preferably 60% by weight or less. If the amount of the polyimide resin (A) mixed is within the range described above, it is possible to impart excellent processability to the thermosetting resin composition and excellent physical properties, such as dielectric characteristics and heat resistance, to a cured resin (cured object) obtained by curing the thermosetting resin composition.

(D) Phosphazene Compound

In the thermosetting resin composition according to the second embodiment of the present invention, a phenolic hydroxyl group-containing compound, i.e., the phenoxyphosphazene compound (D-1) and/or the crosslinked phenoxyphosphazene compound (D-2), is used. The crosslinked phenoxyphosphazene compound (D-2) is a phosphazene compound prepared by crosslinking the phenoxyphosphazene compound (D-1).

Incorporation of the phenoxyphosphazene compound (D-1) and/or the crosslinked phenoxyphosphazene compound (D-2) can impart flame retardance to the resulting thermosetting resin composition without impairing heat resistance. In particular, since the phosphazene compound used in the present invention has a phenolic hydroxyl group in its molecule, compatibility with the polyimide resin (A) can be remarkably improved because of the phenolic hydroxyl group. Consequently, in the resulting thermosetting resin composition, it is possible to prevent the flame retardant from being easily precipitated on the surface (i.e., occurrence of bleeding or juicing), and thus flame retardance can be further improved.

Moreover, since the phenolic hydroxyl group is contained in the molecule, compatibility with the imide resin is significantly improved, and when the thermosetting resin composition is cured, a network structure can be formed by reaction with the cyanate ester compound (E), which will be described below. Consequently, curing can be performed efficiently, and a cured object having excellent heat resistance can be obtained. Furthermore, alkali-solubility can be improved compared with the conventional phosphazene compound.

<(D-1) Phenoxyphosphazene Compound>

The phenoxyphosphazene compound (D-1) used in the present invention is not particularly limited as long as phosphazene compound has a phenolic hydroxyl group. Specifically, at least one of the cyclic phenoxyphosphazene compound (D-11) and the linear phenoxyphosphazene compound (D-12) is preferably used.

The cyclic phenoxyphosphazene compound (D-11) has a structure represented by general formula (2):

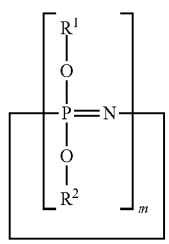

(wherein m represents an integer of 3 to 25; $R^1$ and $R^2$ each represent a phenyl group or a hydroxyphenyl group (—C6H4OH); and at least one hydroxyphenyl group is contained per molecule).

The linear phenoxyphosphazene compound (D-12) has a structure represented by general formula (3):

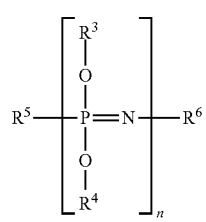

(wherein n represents an integer of 3 to 10,000; $R^3$ and $R^4$ each represent a phenyl group or a hydroxyphenyl group; at least one hydroxyphenyl group is contained per molecule; $R^5$ represents —N=P(OC$_6$H$_5$)$_3$, —N=P(OC$_6$H$_5$)$_2$(OC$_6$H$_4$OH), —N=P(OC$_6$H$_5$)(OC$_6$H$_4$OH)$_2$, —N=P(OC$_6$H$_4$OH)$_3$, —N=P(O)OC$_6$H$_5$, or —N=P(O)(OC$_6$H$_4$OH); and $R^6$ represents —P(OC$_6$H$_5$)$_4$, —P(OC$_6$H$_5$)$_3$(OC$_6$H$_4$OH), —P(OC$_6$H$_5$)$_2$(OC$_6$H$_4$OH)$_2$, —P(OC$_6$H$_5$)(OC$_6$H$_4$OH)$_3$, —P(OC$_6$H$_4$OH)$_4$, —P(O)(OC$_6$H$_5$)$_2$, —P(O)(OC$_6$H$_5$)(OC$_6$H$_4$OH), or —P(O)(OC$_6$H$_4$OH)$_2$).

The cyclic phenoxyphosphazene compound (D-11) and the linear phenoxyphosphazene compound (D-12) have excellent compatibility with the polyimide resin (A) described above and the other components (D), which will be described below, and also can impart excellent heat resistance to a cured object obtained by curing the resulting thermosetting resin composition.

The method for producing the cyclic phenoxyphosphazene compound (D-11) or the linear phenoxyphosphazene compound (D-12) is not particularly limited. Specifically, these compounds can be produced, for example, by the method described in any of the documents described below.

Document A: Masaaki Yokoyama, et al., Kogyo Kagaku Zasshi, Vol. 67, No. 9, p. 1378 (1964)
Document B: Tomoya Okuhashi, et al., Kogyo Kagaku Zasshi, Vol. 73, No. 6, p. 1164 (1970)
Document C: Japanese Unexamined Patent Application Publication No. 58-219190
Document D: Alessandro Medici, et. al., Macromolecules, Vol. 25, No. 10, p. 2569 (1992)
Document E: Japanese Unexamined Patent Application Publication No. 54-145394
Document F: Japanese Unexamined Patent Application Publication No. 54-145395

For example, a compound in which one hydroxyl group of a dihydric phenol is protected with a methyl group or a benzyl group (for the convenience of description, referred to as a "protected phenol compound"), such as 4-methoxyphenol or 4-(benzyloxy)phenol, is synthesized, and then an alkali metal salt (e.g., lithium salt, sodium salt, or potassium salt) of the protected phenol compound is produced. The resulting alkali metal salt of the protected phenol compound (alkali metal salt of 4-methoxyphenol or alkali metal salt of 4-(benzyloxy) phenol) is reacted with phosphonitrilic chloride which is described in each of Documents E and F. Subsequently, by reaction with pyridine hydrohalide, boron tribromide, or the like, the methyl group or the benzyl group is removed to deprotect the hydroxyl group. The phenoxyphosphazene compound is thereby synthesized.

Furthermore, with respect to the phenoxyphosphazene compounds, in order to produce a compound having a phenoxy group partially substituted with the hydroxyl group, an alkali metal salt of the protected phenol compound and/or an alkali salt of hydroxyalkylphenol are prepared. When the resulting alkali metal salts are allowed to react with phosphonitrilic chloride, an alcohol-based or phenol-based alkali metal salt is simultaneously used.

<Example of Synthesis (Production) of Phenoxyphosphazene Compound (D-1)>

A specific example of a method for synthesizing (producing) the cyclic phenoxyphosphazene compound (D-11) or the linear phenoxyphosphazene compound (D-12) will be described below.

First, at least one dichlorophosphazene compound selected from the group consisting of cyclic dichlorophosphazene compounds represented by general formula (12):

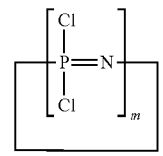

(wherein m represents an integer of 3 to 25) and straight-chain or linear dichlorophosphazene compounds represented by general formula (13);

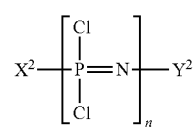

(wherein $X^2$ represents —N=PCl$_3$ or —N=P(O)Cl; $Y^2$ represents —PCl$_4$ or —P(O)Cl$_2$; and n represents an integer of 3 to 10,000) is used as a starting phosphazene compound.

The compound represented by general formula (12) or (13) is allowed to react with alkali metal phenolates represented by general formulae (14) and (15):

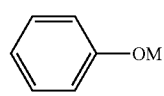

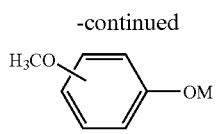

(in each formula, M represents an alkali metal). Additionally, in the alkali metal phenolate represented by general formula (15), the position of the alkyloxy group (methoxy group) is not particularly limited.

By the reaction described above, the phenyl group and the methoxyphenyl group can be introduced into the structure represented by general formula (12) or (13). At this stage, in the structure represented by formula (12) or (13), at least one methoxyphenyl group must be introduced per molecule. In other words, when the compound represented by general formula (12) or (13) is allowed to react with the compounds represented by general formulae (14) and (15), the reaction conditions including the amount (molar ratio equivalent) of the compound represented by general formula (15) must be set so that at least one methoxyphenyl group is introduced per molecule. The details of the reaction conditions are not particularly limited, and known conditions may be used.

By reaction of the resulting compound with pyridine hydrohalide, boron tribromide, or the like, the methoxyphenyl group is removed to deprotect the hydroxyl group. As a result, the cyclic phenoxyphosphazene compound (D-11) represented by general formula (2) or the linear phenoxyphosphazene compound (D-12) represented by general formula (3) can be synthesized.

<(D-2) Crosslinked Phenoxyphosphazene Compound>

As described above, the crosslinked phenoxyphosphazene compound (D-2) has at least one phenolic hydroxyl group and is a compound prepared by crosslinking the phenoxyphosphazene compound (D-1). The crosslinked phenoxyphosphazene compound (D-2) is prepared by crosslinking the phenoxyphosphazene compound (D-1) with a known crosslinking group, and preferably with a phenylene-based crosslinking group.

The phenylene-based crosslinking group is a crosslinking group containing a phenyl group in its structure. Specifically, for example, a phenylene-based crosslinking group contains at least any one of o-phenylene group, m-phenylene group, and p-phenylene group represented as follows:

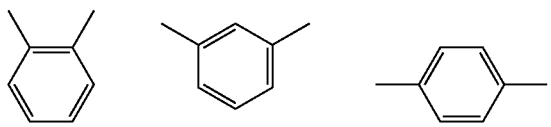

and a bisphenylene group represented by general formula (4):

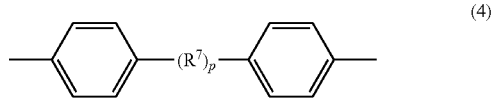

(wherein $R^7$ represents —C(CH$_3$)$_2$—, —SO$_2$—, —S—, or —O—; and p represents 0 or 1).

In the present invention, when the crosslinked phenoxyphosphazene compound (D-2) is synthesized (produced), as the phenoxyphosphazene compound, any corresponding compound may be used. However, preferably, the cyclic phenoxyphosphazene compound (D-11) and/or the linear phenoxyphosphazene compound (D-12) are used. In such a case, preferably, the phenylene-based crosslinking group is used as the crosslinking group.

Furthermore, on the conditions that (1) the cyclic phenoxyphosphazene compound (D-11) and/or linear phenoxyphosphazene compound (D-12) are used as the phenoxyphosphazene compound and (2) the phenylene-based crosslinking group is used as the crosslinking group (2), crosslinking conditions are preferably set so as to satisfy the conditions (3) and (4) described below.

That is, preferably, (3) the phenylene-based crosslinking group lies between two oxygen atoms of the phenoxyphosphazene compound (D-1) (cyclic phenoxyphosphazene compound (D-11) and/or linear phenoxyphosphazene compound (D-12)), the phenyl group and the hydroxyphenyl group being separated from the oxygen atoms; and (4) the content of the phenyl group and the hydroxyphenyl group in the crosslinked phenoxyphosphazene compound is in a range of 50% to 99.9% based on the total number of phenyl groups and hydroxyphenyl groups contained in the phenoxyphosphazene compound.

If a crosslinked phenoxyphosphazene compound (D-2) that satisfies the conditions (1) to (4) is used, it is possible to further improve flame retardance in the resulting thermosetting resin composition. Additionally, the crosslinked phenoxyphosphazene compound that satisfies the conditions (1) to (4) is referred to as a "phenylene-based crosslinked phenoxyphosphazene compound (D-21)".

<Example of Synthesis (Production) of Crosslinked Phenoxyphosphazene Compound (D-2)>

The production method for the crosslinked phenoxyphosphazene compound (D-2) is not particularly limited. An example of the synthesis method will be described below in which the phenylene-based crosslinked phenoxyphosphazene compound (D-21) is taken as an example.

First, a dichlorophosphazene compound represented by general formula (12) or (13) is allowed to react with alkali metal phenolates. As the alkali metal phenolates used in this step, in addition to the alkali metal phenolates represented by general formulae (14) and (15), alkali metal diphenolates represented by general formulae (16) and (17):

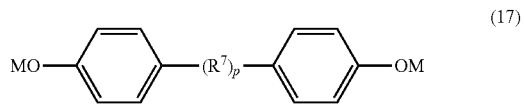

(wherein M represents an alkali metal; $R^7$ represents —C(CH3)2-, —SO2-, —S—, or —O—; and p represents 0 or 1) are used at the same time.

The resulting compound has a structure in which the methoxyphenyl group (and the phenyl group) is introduced into the structure represented by general formula (12) or (13) and in which the structure represented by general formula (12) or (13) is crosslinked by the alkali metal diphenolates represented by general formulae (16) and (17). Subsequently, by reaction with pyridine hydrohalide or boron tribromide, the methyl group or the benzyl group is removed to deprotect the hydroxyl group. As a result, a compound in which the phenoxyphosphazene compound represented by general formula (2) and/or (3) is crosslinked with an aromatic diol, i.e., the phenylene-based crosslinked phenoxyphosphazene compound (D-21), can be produced.

The amount of the phenoxyphosphazene compound (including the crosslinked compound) to be added is not particularly limited, but preferably in a range of 0.1% to 50% by weight based on 100% by weight of the total weight of the thermosetting resin composition. If the amount becomes less than 0.1% by weight, the flame retardance-imparting effect may be decreased. If the amount exceeds 50% by weight, adhesiveness and mechanical characteristics may be degraded.

In particular, in the present invention, the mixing ratio by weight (B)/[(A)+(B)+(C)] is preferably in a range of 0.01 to 0.4, and more preferably in a range or 0.05 to 0.4, the mixing ratio by weight being the ratio of the weight of the phosphazene compound (B) to the total weight of the polyimide resin (A), the phosphazene compound (B), and the cyanate ester compound (E). If the mixing ratio by weight becomes less than 0.01, the flame retardance-imparting effect may be decreased. If the mixing ratio by weight exceeds 0.4, heat resistance, such as resistance to soldering heat, adhesiveness, and dielectric characteristics may be degraded.

Furthermore, with respect to the mixing ratio by weight (A)/[(B)+(C)], the mixing ratio by weight being the ratio of the weight of the polyimide resin (A) to the total weight of the phosphazene compound (B) and the cyanate ester compound (E), the lower limit is preferably 0.4 or more, and particularly preferably 0.5 or more, and the upper limit is preferably 2.0 or less, and particularly preferably 1.5 or less.

If the mixing ratio by weight becomes less than 0.4, i.e., if the content of the phosphazene compound component (B) and the cyanate ester compound component (E) in the thermosetting resin composition becomes relatively larger than the content of the polyimide resin component (A), in a resin sheet before curing, flowability increases and minimum complex viscosity decreases.

Furthermore, in a resin sheet after curing, although heat resistance, which is represented by a modulus of elasticity, a coefficient of linear expansion, and the like, at high temperatures increases, it becomes difficult to achieve a low dielectric constant and a low dielectric loss tangent (hereinafter referred to as excellent dielectric characteristics) in the GHz (gigahertz) range. On the other hand, if the mixing ratio by weight exceeds 2.0, i.e., if the content of the polyimide resin component (A) in the thermosetting resin composition becomes relatively larger than the content of the phosphazene compound component (B) and the cyanate ester compound component (E), although excellent dielectric characteristics can be exhibited in the cured resin in the GHz range, adhesiveness between the thermosetting resin composition and a conductor or a circuit board, and processability during bonding between the thermosetting resin composition and a conductor or a circuit board are degraded.

In the thermosetting resin composition of the present invention, by setting the mixing ratio by weight in the range described above, a cured resin obtained by curing the thermosetting resin composition exhibits excellent dielectric characteristics even in the GHz range. That is, with respect to the dielectric characteristics of a cured resin obtained by heating the thermosetting resin composition at a temperature of 150° C. to 250° C. for 1 to 5 hours, the dielectric constant is 3.3 or less and the dielectric loss tangent is 0.02 or less at a frequency of 1 to 10 GHz. If the dielectric constant and the dielectric loss tangent are in the ranges described above, when the thermosetting resin composition of the present invention is used as a protective material or an interlayer insulating material in a circuit board, it is possible to ensure electrical insulation of the circuit board and to prevent decreases in the transmission speed of signals and loss of signals in the circuit on the circuit board. Therefore, a highly reliable circuit board can be provided.

(E) Cyanate Ester Compound

The cyanate ester compound (E) according to the present invention will now be described. The cyanate ester compound (E) used in the present invention is not particularly limited as long as the compound has a cyanato group and an ester bond. For example, preferably used is at least one cyanate ester compound selected from cyanate ester compounds represented by general formula (18):

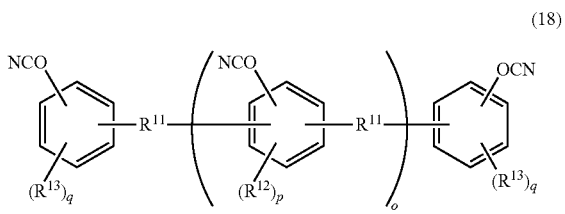

(wherein each $R^{11}$ represents a single bond, a divalent organic group having at least one aromatic ring, —CH2-, —C(CH3)2-, C(CF3)2-, —CH(CH3)-, —CH(CF3)-, —SO2-, —S—, or —O—; o, p, and q each independently represent an integer of 0 to 3; and $R^{12}$ and $R^{13}$ each independently represent an organic group selected from —H, —CH3, and —CF3).

By using the cyanate ester compound represented by general formula (18), it is possible to impart excellent heat resistance to the thermosetting resin composition.

Among the cyanate ester compounds represented by general formula (18), in view of high compatibility with the soluble polyimide resin and easy availability, more preferably, at least one cyanate ester compound selected from compounds represented by the group of general formulae (3):

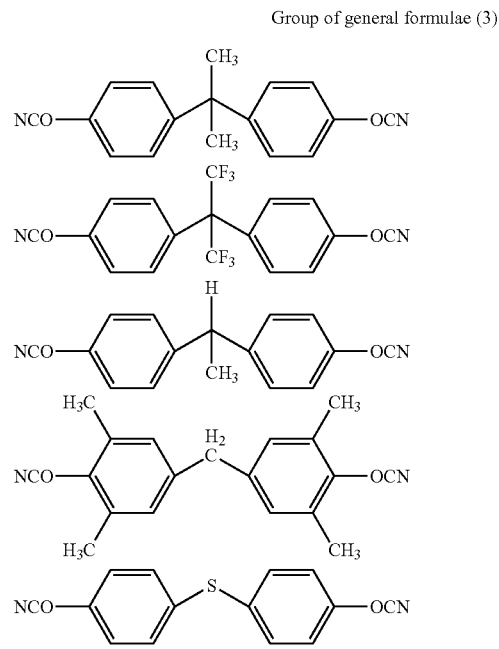

Group of general formulae (3)

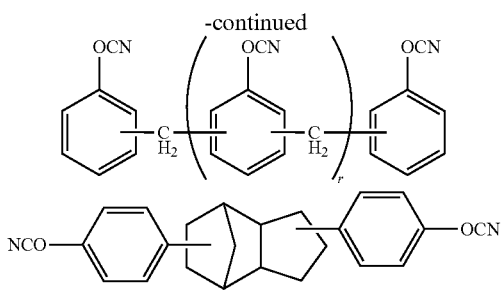

(wherein r represents 0 to 4) is used, and particularly preferably, a cyanate ester compound represented by general formula (19):

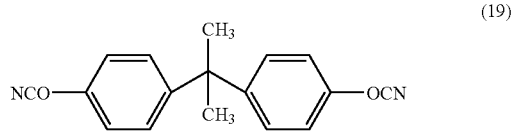

is used.

As the cyanate ester compound (E) used for the thermosetting resin composition of the present invention, any one of the cyanate ester compounds can be used as a monomer. It is also possible to use the cyanate ester compound as an oligomer which is prepared by a partial reaction of the cyanato group of the monomer by heating or the like. Furthermore, the oligomer and the monomer can be used together. Examples of the oligomer of the cyanate ester compound include BA200 (trade name) manufactured by Lonza Inc. and Arocy B-30, B-50, M-30, and M-50 (trade name) manufactured by Asahi-Ciba Ltd. These cyanate ester compounds (E) may be used alone or two or more of these may be combined appropriately.

(G) Other Components

The thermosetting resin composition according to the present invention may contain other components (D), in addition to the polyimide resin (A), the phosphazene compound (B), and the cyanate ester compound (E). The other components (G) are appropriately selected depending on the application of the resulting thermosetting resin composition and are not particularly limited. Specifically, examples of the other components include a curing catalyst (G-1) for improving a thermosetting property and other resins (G-2).

(G-1) Curing Catalyst

In the thermosetting resin composition of the present invention, the cyanate ester compound (E) must be subjected to reaction to such an extent that excellent dielectric characteristics can be exhibited after curing. In some case, the reaction of the cyanate ester compound (E) requires a high temperature of 200° C. or more and a time of 2 hours or more. Therefore, in order to promote the reaction of the cyanate ester compound (E), a curing catalyst (G-1) is preferably used.

Any compound capable of promoting reaction of the cyanate ester compound (E) can be used as the curing catalyst (G-1) without limitation. Specific examples thereof include metal-based catalysts, such as zinc(II) acetylacetonate, zinc naphthenate, cobalt(II) acetylacetonate, cobalt(III) acetylacetonate, cobalt naphthenate, copper(II) acetylacetonate, and copper naphthenate; and hydroxyl group-containing organic compounds, such as N-(4-hydroxyphenyl)maleimide, p-tert-octylphenol, cumylphenol, and phenol resins. These curing catalysts (G-1) may be used alone or two or more of these may be combined appropriately.

Among the curing catalyst (G-1) described above, from the standpoint that curing can be further promoted, use of the metal-based catalyst is preferable. In particular, zinc(II) acetylacetonate and copper(II) acetylacetonate are preferable. The amount of the curing catalyst (G-1) mixed varies depending on the types of the curing catalyst (G-1) used and the extent of the promotion of reaction. For example, if the during catalyst is a metal-based curing catalyst, the curing catalyst is used preferably in an amount of 0.001 parts by weight to 0.1 parts by weight based on 100 parts by weight of the cyanate ester compound (E). If the curing catalyst is an organic compound, the curing catalyst is used preferably in an amount of 0.1 parts by weight to 20 parts by weight based on 100 parts by weight of the cyanate ester compound (E). In particular, when zinc(II) acetylacetonate or copper(II) acetylacetonate is used, the curing catalyst is used preferably in an amount of 0.001 parts by weight to 0.05 parts by weight based on 100 parts by weight of the cyanate ester compound (E). If the amount of the curing catalyst (D-1) used is below the range described above, the effect of promoting reaction is not easily obtained. If the amount exceeds the range described above, there is a possibility that storage stability of the resulting thermosetting resin composition will be impaired, which is undesirable.

<(G-2) Other Resins>

The thermosetting resin composition of the present invention may contain other resins (G-2) as thermosetting components, besides the cyanate ester compound (E). The other resins (G-2) are not particularly limited as long as the resins improve various characteristics, such as adhesiveness, heat resistance, and processability. Preferably, the other resins are selected to such an extent that the dielectric characteristics of the thermosetting resin composition are not impaired. Examples of the other resins (G-2) include thermosetting resins, such as bismaleimide resins, bisallylnadiimide resins, phenol resins, epoxy resins, acrylic resins, methacrylic resins, curable hydrosilyl resins, curable allyl resins, and unsaturated polyester resins; and reactive side-chain group-containing thermosetting polymers having reactive groups, such as an epoxy group, an allyl group, a vinyl group, an alkoxysilyl group, or a hydrosilyl group, in side chains or in termini of the molecular chain. In the thermosetting resin composition, these resins may be used alone or in appropriate combination.

<Production of Thermosetting Resin Composition>

The method for producing (preparing) the thermosetting resin composition of the present invention, i.e., the method for compounding the individual components described above, is not particularly limited. For example, in a method, a solution of the thermosetting resin composition is prepared using an organic solvent that satisfactorily dissolves the individual components. More specifically, for example, the individual components are added to a suitable solvent, followed by stirring to obtain a solution of the thermosetting resin composition. Alternatively, the individual components are dissolved in suitable solvents to prepare respective solutions of the components, and these solutions are mixed to obtain a solution of the thermosetting resin composition.

As the organic solvent used in this process, a known organic solvent used for polyimide resins can be used. Examples of the organic solvent include aromatic hydrocarbons, ketones, esters, ethers (e.g., cyclic ethers and glycol ethers), N-substituted amides, alcohols, carboxylic acids, amines, and chlorine-based solvents. In particular, a low-boiling organic solvent having a boiling point of 170° C. or less, preferably 160° C. or less, can be preferably used.

Examples of the low-boiling organic solvent which may be preferably used include ethers, such as cyclic ethers, e.g., tetrahydrofuran, dioxolane, and dioxane, and linear ethers, e.g., ethylene glycol dimethyl ether, triglyme, diethylene glycol, Ethyl Cellosolve, Methyl Cellosolve, diethyl ether, and various types of propylene glycol ether; alcohols, such as methanol, ethanol, isopropyl alcohol, and butanol; ketones, such as acetone, methyl ethyl ketone, and methyl isobutyl ketone; cycloalkanes, such as cyclopentanone and cyclohexanone; and esters, such as ethyl acetate. Furthermore, any of mixed solvents prepared by mixing ethers with toluene, xylenes, glycols, N,N-dimethylformamide, N,N-dimethylacetamide, N-methylpyrrolidone, cyclic siloxane, linear siloxane or the like can also be preferably used. These organic solvents may be used alone or two or more of these may be appropriately mixed for use. Furthermore, with respect to an organic solvent compatible with water, the organic solvent may be used as a mixture with water.

As described above, the thermosetting resin composition according to the present invention may be in the form of a solution in which the thermosetting resin composition is dissolved in an organic solvent (preferably a low-boiling organic solvent). Such a solution of the thermosetting resin composition can be suitably used as a coating material. Consequently, in the thermosetting resin composition of the present invention, the organic solvent and water may be contained in other components (H). In a typical example of the solution of the thermosetting resin composition according to the present invention, the thermosetting resin composition is dissolved in dimethylformamide or dimethylacetamide in an amount of preferably 1% by weight or more, and more preferably 5% by weight or more.

<Use of Thermosetting Resin Composition>

Use of the thermosetting resin composition according to the present invention is not particularly limited. Specifically, examples of the use include resin films and resin sheets formed using the thermosetting resin composition, and resin preparations.

The resin films can be suitably used, for example, as adhesive sheets for printed circuit boards, coverlay films, insulative circuit protective film for printed circuit boards, and substrates for printed circuit boards. The resin preparations can be suitably used as adhesives for printed circuit boards, sealing materials for printed circuit boards, protecting agents for circuits, and cover ink.

Furthermore, another use of the present invention is for a multilayer body which includes at least one resin layer formed of the thermosetting resin composition or using a resin film or a resin preparation prepared using the thermosetting resin composition. The multilayer body can be suitably used, for example, as a circuit board or a multilayer printed circuit board.

The resin film, the resin preparation, and the multilayer body will be described based on a specific example.

The thermosetting resin composition according to the present invention can be used as a resin preparation in a solution state. The thermosetting resin composition may also be used as a resin preparation by incorporation of various solvents and additives according to need. The resin preparation containing the thermosetting resin composition of the present invention can be used as a coating material or varnish, which, for example, may be impregnated into various fibers, such as glass cloths, glass mats, aromatic polyamide fiber cloths, and aromatic polyamide fiber mats. By semi-curing the thermosetting resin composition thus impregnated into the fibers, it is possible to obtain fiber-reinforced resin sheets.

Furthermore, the thermosetting resin composition of the present invention may be preliminarily formed into sheets and then be used as resin films or resin sheets. Specific examples thereof include (1) a one-layer sheet composed of only the thermosetting resin composition, (2) a two-layer or three-layer sheet formed by disposing a resin layer composed of the thermosetting resin composition to one surface or both surfaces of a film serving as a base (film base), and (3) a multilayer body in which film bases and resin layers composed of the thermosetting resin composition are alternately laminated.

The resin sheet can be produced by a method in which the solution of the thermosetting resin composition or the resin preparation is flow-cast or applied onto a surface of a support, followed by drying, to form into a film. The film of the resulting thermosetting resin composition (resin film) is in a semi-cured state (stage B). Thus, by separating the semi-cured resin film from the support, the one-layer sheet can be obtained. Furthermore, the multilayer body can be produced by a method in which the solution of the thermosetting resin composition or the resin preparation is flow-cast or applied onto a surface of the film base, followed by drying, and this operation is repeated.

Any known resin film or resin sheet can be used as a material for the film base without limitation. For example, if a metal, such as copper or aluminum, is used as the film base, a metal-clad laminate can be produced. That is, the metal-clad laminate is a multilayer body including at least one resin layer composed of the thermosetting resin composition and at least one metal layer. The resin layer may be disposed only one surface of the metal layer. Alternatively, metal layers and resin layers may be alternately laminated.

The metal-clad laminate may be produced by flow-casting or applying the solution of the thermosetting resin composition or the resin preparation onto a surface of a metal layer, followed by drying, as described above. Alternatively, the metal-clad laminate may be produced by bonding a metal foil to the resin sheet, or by forming a metal layer on the surface of the resin sheet by chemical plating, sputtering, or the like. Furthermore, when the metal layer is composed of a metal that can be used as a conductor for a circuit board, the metal layer of the metal-clad laminate may be subjected to metal etching using a dry film resist, a liquid resist, or the like to form a circuit having a desired pattern (hereinafter referred to as a patterned circuit). Consequently, by forming a patterned circuit in the metal layer of the metal-clad laminate and providing a resin layer composed of the thermosetting resin composition of the present invention, the resulting multilayer body can be used as a circuit board, such as a flexible printed circuit board or a build-up circuit board.

When a metal layer provided with a patterned circuit is used as the metal layer, the semi-cured resin sheet described above may be used as a resin layer. Since the semi-cured resin sheet composed of the thermosetting resin composition of the present invention has a moderate degree of flowability, the patterned circuit can be suitably embedded when thermal press bonding, such as thermal pressing, lamination (thermal lamination), or hot roll lamination, is performed. As a result, the metal layer and the resin layer can be bonded together satisfactorily.

The process temperature of the thermal press bonding is not particularly limited as long as press bonding can be performed sufficiently. The process temperature is in a range of preferably 50° C. to 200° C., more preferably 60° C. to 180° C., and particularly preferably 80° C. to 130° C. At a process temperature exceeding 200° C., the resin layer may be cured during thermal press bonding. On the other hand, at a process temperature less than 50° C., the flowability of the resin layer is low, and it is difficult to embed the patterned circuit.

The resin layer disposed on the patterned circuit serves as a protective material for protecting the patterned circuit or as an interlayer insulating material in a multilayer circuit board. Therefore, after the patterned circuit is embedded, it is preferable to completely cure the resin layer by exposure treatment, thermal curing, or the like.

Additionally, when the thermosetting resin composition of the present invention is cured, in order to allow curing reaction of the cyanate ester compound component (E) to proceed sufficiently, preferably, post-heating is performed after bonding of the metal layer to the resin layer. The conditions of the post-heating are not particularly limited. Preferably, the post-heating is performed at 150° C. to 200° C. for 10 minutes to 3 hours.

As described above, the thermosetting resin composition of the present invention is excellent in dielectric characteristics, heat resistance, and flame retardance because of the individual components contained therein, and excellent in processability and handleability because of the thermosetting components contained therein, these various physical properties being well-balanced. Therefore, it is possible to sufficiently overcome the problems associated with the conventional insulating layers. As a result, the thermosetting resin composition can be suitably used for manufacturing various laminated structures, for example, laminated materials, such as flexible printed circuit boards (FPCs) and multilayer build-up circuit boards, which require allow dielectric constant and a low dielectric loss tangent.

Furthermore, the thermosetting resin composition of the present invention may, of course, contain components other than those described above as long as its characteristics are not degraded. Similarly, in the thermosetting resin composition of the present invention, process steps other than those described above may be, of course, involved.

EXAMPLES

While the present invention will be described more specifically based on examples and comparative examples below, it is to be understood that the present invention is not limited thereto. Persons skilled in the art may apply various changes, modifications, and alternations without deviating from the scope of the present invention.

The flowability, laminatability, and calculation of the volatile component content of a resin sheet composed of the thermosetting resin composition of the present invention and the dielectric characteristics, glass transition temperature, resistance to soldering heat, and flame retardance of a cured resin sheet formed by thermally curing the resin sheet were measured and evaluated as described below.

[Flowability]

With respect to resin sheets before thermal curing, using a dynamic viscoelasticity analyzer (CVO, manufactured by Bohling Corp.) in the shear mode, the complex viscosity (Pa·s) was measured under the conditions described below. The complex viscosity of each resin sheet was evaluated based on the lowest complex viscosity in the measurement temperature range.

Measurement frequency: 1 Hz
Heating rate: 3.5° C./min
Sample measured: Circular resin sheet with a diameter of 3 mm

[Laminatability]

A resin sheet (50 µm thick) was interposed between a circuit-forming surface of a glass epoxy substrate FR-4 (MCL-E-67, manufactured by Hitachi Chemical Co., Ltd.; thickness of copper foil: 12 µm, total thickness: 1.2 mm) having a circuit with a height of 18 µm, a circuit width of 50 µm, and a circuit spacing of 50 µm and a glossy surface of a copper foil (BHY22BT, manufactured by Japan Energy Corporation), and heat and pressure were applied for one hour at a temperature of 180° C. and a pressure of 3 MPa to produce a laminate. The copper foil of the resulting laminate was chemically removed using an iron(III) chloride-hydrochloric acid solution. The exposed surface of the resin sheet was visually observed using an optical microscope (magnification; 50 times) to check whether or not bubbles were included in the space between the circuits.

Laminatability was evaluated according to the following criteria:

Satisfactory (○): No inclusion of bubbles was observed in the space between the circuits.

Unsatisfactory (x): Inclusion of bubbles was observed.

[Calculation of Volatile Component Content in Resin Sheet]

Using a thermogravimetric analyzer (TGA50, manufactured by Shimadzu Corporation), a resin sheet was placed in a sample container, and changes in weight were observed under the conditions described below. The volatile component content was determined as the ratio of the decrease in weight in the temperature range of 100° C. to 300° C. to the weight of the resin sheet before the change.

Measurement temperature range: 15° C. to 350° C.
Heating rate: 20° C./min
Measurement atmosphere: Nitrogen, flow rate 50 mL/min
Sample container: composed of aluminum

[Dielectric Characteristics]

Using a cavity resonator for complex permittivity measurement in perturbation method (trade name, manufactured by Kanto Electronics Application and Development Inc.), the dielectric constant and dielectric loss tangent of a cured resin sheet were measured under the following conditions:

Measurement frequency: 3 GHz, 5 GHz, and 10 GHz
Measurement temperature: 22° C. to 24° C.
Measurement humidity: 45% to 55%
Sample measured: Resin sheet left to stand for 24 hours at the above-described measurement temperature and humidity

[Glass Transition Temperature]

Using a DMS-200 (manufactured by Seiko Instruments & Electronics Ltd.), the storage modulus (∈') of a cured resin sheet was measured at a measurement length (fixture gap) of 20 mm under the conditions described below, and the inflection point of the storage modulus (∈') was determined as the glass transition temperature (° C.).

Measurement atmosphere: dry air atmosphere
Measurement temperature: 20° C. to 400° C.
Sample measured: Cured resin sheet strip having a width of 9 mm and a length of 40 mm

[Resistance to Soldering Heat]

A copper foil laminate having copper layers on both surfaces, which was obtained in each example described below, was prepared and humidity controlling was performed under the conditions described below. The copper foil laminate was then dipped in a molten solder at 260° C. for one minute, and the copper foil on one side only was etched. Subsequently, the resin portion was visually checked. If no defects, such as bubbling and blistering were observed, the sample was considered to be satisfactory.

Shape of sample; 15 mm×30 mm

Humidity control conditions: Left to stand for 24 hours at a temperature of 22.5° C. to 23.5° C. and a humidity of 39.5% to 40.5%.

[Flame Retardance]

Evaluation was conducted according to the UL standard.

Synthesis Example 1

Polyimide Resin

Into a 2,000-mL glass flask charged with dimethylformamide (hereinafter referred to as "DMF"), 0.95 equivalents of 1,3-bis(3-aminophenoxy)benzene (hereinafter referred to as "APB") and 0.05 equivalents of 3,3'-dihydroxy-4,4'-diaminobiphenyl (manufactured by Wakayama Seika Kogyo Co., Ltd.) were added and dissolved under stirring in a nitrogen atmosphere to prepare a DMF solution. Subsequently, after the flask was purged with nitrogen, the DMF solution was cooled in an ice bath under stirring, and 1 equivalent of 4,4'-(4,4'-isopropylidenediphenoxy)bisphthalic anhydride (hereinafter referred to as "IPBP") was added thereto. The resulting mixture was stirred further for 3 hours to obtain a polyamic acid solution. The amount of the DMF used was set so that the charge ratio of APB, 3,3'-dihydroxy-4,4'-diaminobiphenyl, and IPBP monomers was 30% by weight.

The polyamic acid solution in an amount of 300 g was transferred to a vat coated with a fluororesin, reduced pressure heating was performed in a vacuum oven for 3 hours at 200° C. and 5 mmHg (about 0.007 atmospheric pressure, about 5.65 hPa), and thereby a polyimide resin was obtained.

Synthesis Example 2

Synthesis of Phosphazene Compound as Starting Material

Into a 5-L flask equipped with a reflux condenser, a thermometer, an agitator, a phosphorus trichloride dropping funnel, and a chlorine gas blowing tube, 2.5 L of chlorobenzene, 182.5 g (3.4 mol) of ammonium chloride, and 2.5 g of zinc chloride were charged to prepare a mixed dispersion liquid. The dispersion liquid was heated to 130° C., and 425.5 g of phosphorus trichloride was dripped under refluxing at a rate of 9 g/min over 48 minutes. At the same time, 227 g of chlorine gas was fed at a rate of 5 g/min over 46 minutes. After phosphorus trichloride and chlorine gas were fed, reflux (131° C.) was further performed for 150 minutes to complete the reaction. Subsequently, unreacted ammonium chloride was removed by suction filtration. The filtrate was subjected to a reduced pressure of 1.0 to 3.0 hPa, and chlorobenzene was distilled off at 30° C. to 50° C. Thereby, 352 g of a reaction product was obtained. The yield of the reaction product on the basis of phosphorus trichloride was 98.1%.

The resulting reaction product was redissolved in chlorobenzene, and a mixture of hexachlorocyclotriphosphazene and octachlorocyclotetraphosphazene (226 g, hexachlorocyclotriphosphazene: 76%, octachlorocyclotetraphosphazene: 24%) was obtained by recrystallization.

The chlorobenzene solution remaining after the recrystallization was concentrated, and 125 g of a mixture of cyclic chlorophosphazene compounds (wherein m represents 3 to 15) was obtained. Furthermore, the mixture of hexachlorocyclotriphosphazene and octachlorocyclotetraphosphazene which was obtained first was subjected to recrystallization three times using hexane, and thereby, 155 g of hexachlorocyclotriphosphazene with a purity of 99.9% was obtained.

Synthesis Example 3

Synthesis of Phenoxyphosphazene Compound (D-1)

Into a 2-L four-necked flask equipped with a reflux condenser, a thermometer, an agitator, and a dropping funnel, 58 g (0.5 unit mol, NPC12 being one unit) of hexachlorocyclotriphosphazene with a purity of 99.9% and 100 mL of THF were charged to prepare a solution. Subsequently, a separately prepared THF solution of Na salt of 4-methoxyphenol (4-methoxyphenol 68.3 g (0.55 mol), sodium 11.1 g (0.44 g-atom), and THF 200 mL) was added dropwise to the THF solution of hexachlorocyclotriphosphazene over one hour under stirring. Since the reaction was highly exothermic, the reaction was allowed to proceed while properly cooling so that the reaction temperature did not exceed 30° C. After dropping was completed, stirring was continued for 6 hours at 60° C. The residual chlorine content in the partially substituted compound obtained by this reaction was 15.78%, and the estimated structure was N3P3Cl3.36(OC6H4OCH3) 2.63.

Subsequently, a separately prepared THF solution of a sodium phenolate (phenol 61.2 g (0.65 mol), sodium 13.8 g (0.6 g-atom), and THY 200 mL) was added dropwise to the reaction solution over one hour while cooling so that the reaction temperature was controlled to 30° C. or less. Subsequently, the reaction was carried out at room temperature for 5 hours and at the reflux temperature for 3 hours to complete the reaction. After the reaction was completed, the solvent, i.e., THF, was removed by distillation under reduced pressure, and then 500 mL of toluene was added thereto to redissolve the product. Water (300 mL) was further added to perform washing and liquid separation. The organic layer was washed with a 5% by weight aqueous sodium hydroxide solution and washed with a 2% by weight aqueous sodium hydroxide solution each once. Then, washing was performed with an (1+9) aqueous hydrochloric acid solution once, with a 5% by weight aqueous sodium hydrogencarbonate once, and with water twice to neutralize the aqueous layer.

Subsequently, the organic layer was separated and dehydrated with anhydrous magnesium sulfate, and toluene was removed by distillation to obtain 122.6 g of a light yellow oily product (yield 95%). The residual chlorine content was 0.01% or less.

Into a 2-L four-necked flask, 116.2 g (0.45 unit mol) of the 4-methoxyphenoxy and phenoxy groups mixed, substituted cyclotriphosphazene obtained by the method described above and 583.6 g (5.05 mol) of pyridine hydrochloride were charged. The temperature was gradually increased, and a reaction was carried out at 205° C. to 210° C. for one hour. After cooling to room temperature, 300 mL of water was added to dissolve the reaction product and the excess pyridine hydrochloride, and the reaction solution was controlled to pH6 to 7 with a 20% by weight aqueous sodium hydroxide solution.

Subsequently, extraction was performed four times using 500 mL of ethyl acetate. Then, the extracts were combined, and washing was performed four times with 500 mL of saturated aqueous sodium sulfate. The organic layer was separated and dehydrated with anhydrous magnesium sulfate, and ethyl acetate was removed by distillation under reduced pressure. Subsequently, the concentrate was dissolved in 200 mL of methanol, and the resulting solution was poured into 1.5 L of water to precipitate crystals. This process was repeated three times. The resulting crystals were dried under reduced pressure to obtain 90.5 g of a yellow solid (yield 81.8%).

In the resulting compound, the residual chlorine content was 0.01% or less, and the hydroxyl group content was 6.1% (theoretical value 6.1%, structural formula N3P3(OPh)3.36 (OC6H4OH)2.63, hydroxyl group equivalent 279 g/eq).

First Embodiment

Example 1

The polyimide resin (PI) prepared as described above, a dicyclopentadiene-type epoxy resin (HP7200, epoxy value=277 g/eq, manufactured by Dainippon Ink and Chemicals, Inc.) as an epoxy resin (EP), 11 g of a naphthol/cresol copolymer-type phenol resin (NC30, hydroxyl value=126 g/eq, manufactured by Gunei Chemical Industry Co., Ltd.) as a phenol resin (PH), and 2-ethyl-4-methylimidazole (manufactured by Shikoku Chemicals Co., Ltd.; 2E4MZ in Table 1) as a curing accelerator (CA), at a mixing ratio shown in Table 1, were dissolve in dioxolane to prepare a resin solution.

The resulting resin solution was flow-cast on a surface of a 125-μm-thick PET film (trade name: Cerapeel HP, manufactured by Toyo Metallizing Co., Ltd.) serving as a support. The cast resin was heat-dried in a hot-air oven at 60° C., 80° C., 100° C., 120° C., and 140° C. for three minutes each to produce a two-layer sheet having the PET film as a film base. From this two-layer sheet, the PET film was removed to obtain a one-layer resin sheet. The thickness of the resulting one-layer resin sheet (before thermal curing) was 50 μm. The resin flowability, laminatability, and volatile component content of the resulting resin sheet (before thermal curing) were evaluated according to the evaluation methods described above. The results thereof are shown in Table 2.

Furthermore, the resin sheet was interposed between rolled copper foils (BHY-22B-T, manufactured by Japan Energy Corporation) having a thickness of 18 μm such that the resin sheet came into contact with the roughened surfaces of the rolled copper foils. The resin sheet and the foils were thermally pressed for one hour at 180° C. and a pressure of 3 MPa to produce a copper foil laminate (including the one-layer resin sheet sandwiched between the rolled copper foils). The copper foils were removed from the resulting copper foil laminate by etching to obtain a cured resin sheet. The dielectric characteristics and the glass transition temperature of the cured resin sheet were measured. The results thereof are shown in Table 3.

Examples 2 to 4

A resin sheet (before thermal curing) and a cured resin sheet obtained by curing this resin sheet were produced as in Example 1 except that the polyimide resin, the epoxy resin, the phenol resin, and the curing accelerator shown in Table 1 were mixed at the ratio shown in Table 1. Note that, in Table 1, 157S65 (manufactured by Japan Epoxy Resin Co., Ltd.) is a bisphenol A novolac-type epoxy resin, EXA4701 (manufactured by Dainippon Ink and Chemicals, Inc.) is a naphthalene-type epoxy resin. Furthermore, PS6492 (manufactured by Gunei Chemical Industry Co., Ltd.) is a cresol/melamine copolymer-type phenol resin, and PSM4324 (manufactured by Gunei Chemical Industry Co., Ltd.) is a phenol novolac-type phenol resin.

The flowability, laminatability, and volatile component content of the resulting resin sheet were evaluated. The dielectric characteristics and the glass transition temperature of the cured resin sheet were evaluated. The results thereof are shown in Tables 2 and 3.

Comparative Examples 1 and 2

A resin sheet (before thermal curing) and a cured resin sheet obtained by curing this resin sheet were produced as in Example 1 except that the polyimide resin, the epoxy resin, the phenol resin, and the curing accelerator were mixed at the ratio shown in Table 1. The flowability, laminatability, and volatile component content of the resulting resin sheet were evaluated. The dielectric characteristics and the glass transition temperature of the cured resin sheet were evaluated. The results thereof are shown in Tables 2 and 3.

TABLE 1

|  | Example | | | | Comparative Example | |
| --- | --- | --- | --- | --- | --- | --- |
|  | 1 | 2 | 3 | 4 | 1 | 2 |
| Polyimide resin (PI) | | | | | | |
| Amount used (g) | 65 | 30 | 50 | 50 | 20 | 70 |
| Epoxy resin (EP) | | | | | | |
| Type | HP7200HH*[1] | 157S65*[2] | EXA4701*[1] | | HP7200HH*[1] | |
| Epoxy value (g/eq) | 277 | 277 | 208 | 167 | 277 | 277 |
| Amount used (g) | 24 | 48 | 38 | 29 | 58 | 22 |
| Number of moles of epoxy group (mol) | 0.087 | 0.174 | 0.183 | 0.174 | 0.209 | 0.079 |
| Phenol resin (PH) | | | | | | |
| Type*[3] | NC30 | | PS6492 | PSM4324 | PSM4324 | |
| Phenol value (g/eq) | 126 | 126 | 148 | 104 | 104 | 104 |
| Amount used (g) | 11 | 22 | 12 | 21 | 22 | 8 |
| Number of moles of phenolic hydroxyl group (mol) | 0.087 | 0.174 | 0.081 | 0.202 | 0.212 | 0.077 |

TABLE 1-continued

|  | Example | | | | Comparative Example | |
| --- | --- | --- | --- | --- | --- | --- |
|  | 1 | 2 | 3 | 4 | 1 | 2 |
| Curing accelerator (CA) | | | | | | |
| Type | | | 2E4MZ | | | 2E4MZ |
| Amount used (g) | 0.24 | 0.48 | 0.04 | 0.3 | 0.6 | 0.2 |
| Mixing ratio | | | | | | |
| PI/(PH + EP)[mass] | 1.85 | 0.43 | 1.00 | 1.00 | 0.25 | 2.33 |
| PH/EP [mole] | 1.00 | 1.00 | 0.44 | 1.16 | 1.01 | 0.97 |

*[1]HP7200HH, EXA4701: manufactured by Dainippon Ink and Chemicals, Inc.
*[2]157S65: manufactured by Japan Epoxy Resin Co., Ltd.
*[3]Phenol resin (NC30, PS6492, PSM4324): Gunei Chemical Industry Co., Ltd.

TABLE 2

|  |  | Complex viscosity (Pa·S) | Laminatability | Volatile component content (% by weight) |
| --- | --- | --- | --- | --- |
| Example | 1 | $4.3 \times 10^3$ | ○ | 3.5 |
|  | 2 | $2.1 \times 10^3$ | ○ | 3.2 |
|  | 3 | $2.8 \times 10^3$ | ○ | 3.1 |
|  | 4 | $3.4 \times 10^3$ | ○ | 3.3 |
| Comparative | 1 | $1.0 \times 10^3$ | ○ | 2.8 |
| Example | 2 | $2.0 \times 10^4$ | x | 3.6 |

TABLE 3

|  |  | Glass transition temperature (°C.) | Dielectric characteristics (dielectric constant/dielectric loss tangent) | | |
| --- | --- | --- | --- | --- | --- |
|  |  |  | Frequency: 3 GHz | Frequency: 5 GHz | Frequency: 10 GHz |
| Example | 1 | 152 | 2.9/0.011 | 2.8/0.011 | 2.8/0.012 |
|  | 2 | 159 | 3.1/0.017 | 3.1/0.017 | 3.1/0.017 |
|  | 3 | 174 | 3.0/0.018 | 3.0/0.018 | 3.0/0.019 |
|  | 4 | 149 | 3.1/0.018 | 3.1/0.019 | 3.1/0.020 |
| Comparative | 1 | 161 | 3.3/0.024 | 3.2/0.024 | 3.2/0.027 |
| Example | 2 | 151 | 3.0/0.012 | 3.0/0.012 | 2.9/0.013 |

As is obvious from the results described above, by producing a resin sheet using a thermosetting resin composition in which the mixing ratio by weight (A)/[(B)+(C)] is set at 0.4 to 2.0, the mixing ratio by weight being the ratio of the weight of a polyimide resin (A) to the total weight of a phenol resin (B) and an epoxy resin (C), it is possible to achieve excellent flowability and laminatability and to obtain a cured resin sheet having excellent dielectric characteristics and the glass transition temperature that can result in good heat resistance and plasticity.

Second Embodiment

Example 5

A resin solution was prepared by dissolving 50 g of the soluble polyimide resin obtained in Synthesis Example 1, 25.0 g of 2,2'-bis(4-phenylcyanate)propane (trade name: BADCY, manufactured by Lonza Inc.), i.e., bisphenol A-based cyanate ester compound, as a cyanate ester compound, and 25.0 g of phenoxyphosphazene compound (hydroxyl group equivalent=279 g/eq) obtained in Synthesis Example 2 in dioxolane. The summary of the composition is shown in Table 4.

The resulting resin solution was flow-cast on a surface of a 125-μm-thick PET film (trade name: Cerapeel HP, manufactured by Toyo Metallizing Co., Ltd.) serving as a support. The cast resin was heat-dried in a hot-air oven at 60° C., 80° C., 100° C., 120° C., and 140° C. for three minutes each to produce a two-layer resin sheet having the PET film as a base. From this two-layer sheet, the PET film was removed to obtain a one-layer resin sheet. The thickness of the resulting one-layer resin sheet (before thermal curing) was 50 μm. The resulting resin sheet was interposed between rolled copper foils (trade name: BHY-22B-T, manufactured by Japan Energy Corporation) having a thickness of 18 μm such that the surfaces of the resin sheet were in contact with the roughened surfaces of the rolled copper foils. The resin sheet and the foils were thermally pressed for one hour at 200° C. and a pressure of 3 MPa to produce a copper foil laminate (including the one-layer resin sheet sandwiched between the rolled copper foils).

Using the resulting copper foil laminate having copper foil layers at both surfaces, resistance to soldering heat was evaluated.

The result thereof is shown in Table 5. Furthermore, the copper foils of the resulting copper foil laminate were removed by etching to obtain a cured sheet. The dielectric characteristics, glass transition temperature, and flame retardance of the resulting cured sheet were measured. The results thereof are shown in Table 5.

Examples 6 to 11

A thermosetting resin composition was prepared as in Example 1 except that the soluble polyimide resin, the phosphazene compound, the cyanate ester compound, and the curing accelerator were mixed at a predetermined ratio shown in Table 4. As the cyanate ester compound, in Examples 6 and 7, BADCY was used, and in Example 8, 4,4'-methylenebis (2,6-dimethylphenylcyanate) (trade name: Methylcy, manufactured by Lonza Inc.) was used. In Example 9, 2,2'-bis(4-phenylcyanate)-hexafluoropropane (trade name: fluorocy, manufactured by Lonza Inc.) was used, and in Example 6, oligo(3-methylene-1,5-phenylenecyanate) (trade name: PT-60, manufactured by Lonza Inc.) was used.

Using the resulting thermosetting resin composition, a resin sheet (before thermal curing) and a cured resin sheet were obtained using the same method conditions as those in Example 5. The resistance to soldering heat, dielectric characteristics, glass transition temperature, and flame retardance of each of the resulting resin sheets were measured. The results thereof are shown in Table 5.

Comparative Example 3

A resin solution was prepared by dissolving 50 g of the soluble polyimide resin obtained in Synthesis Example 1 and 50.0 g of 2,2'-bis(4-phenylcyanate)propane (trade name: BADCY, manufactured by Lonza Inc.), i.e., a bisphenol A-based cyanate ester compound, as a cyanate ester compound, in dioxolane. The summary of the composition is shown in Table 1.

The resulting resin solution was flow-cast on a surface of a 125-μm-thick PET film (trade name: Cerapeel HP, manufactured by Toyo Metallizing Co., Ltd.) serving as a support. The cast resin was heat-dried in a hot-air oven at 60° C., 80° C., 100° C., 120° C., and 140° C. for three minutes each to produce a two-layer resin sheet having the PET film as a base.

The PET film was removed from the resin sheet to obtain a one-layer resin sheet. The thickness of the resulting one-layer resin sheet (before thermal curing) was 50 μm. The resulting resin sheet was interposed between rolled copper foils (trade name: BHY-22B-T, manufactured by Japan Energy Corporation) having a thickness of 18 μm such that the surfaces of the resin sheet were in contact with the roughened surfaces of the rolled copper foils. The resin sheet and the foils were thermally pressed for one hour at 200° C. and a pressure of 3 MPa to produce a copper foil laminate (including the one-layer resin sheet sandwiched between the rolled copper foils).

Using the resulting copper foil laminate having copper foil layers at both surfaces, resistance to soldering heat was evaluated.

The result thereof is shown in Table 5. Furthermore, the copper foils of the resulting copper foil laminate were removed by etching to obtain a cured sheet. The dielectric characteristics, glass transition temperature, and flame retardance of the resulting cured sheet were measured. The results thereof are shown in Table 5.

Comparative Example 4

A resin solution was prepared by dissolving 50 g of the soluble polyimide resin obtained in Synthesis Example 1, 35.0 g of 2,2'-bis(4-phenylcyanate)propane (trade name: BADCY, manufactured by Lonza Inc.), i.e., a bisphenol A-based cyanate ester compound, as a cyanate ester compound, and 15.0 g of 2,2-bis(3,5-dibromo-4-hydroxyphenyl) propane (hereinafter referred to as TB-BPA, manufactured by Wako Pure Chemical Industries, Ltd.) in dioxolane. The summary of the composition is shown in Table 4.

The resulting resin solution was flow-cast on a surface of a 125-μm-thick PET film (trade name: Cerapeel HP, manufactured by Toyo Metallizing Co., Ltd.) serving as a support. The cast resin was heat-dried in a hot-air oven at 60° C., 80° C., 100° C., 120° C., and 140° C. for three minutes each to produce a two-layer resin sheet having the PET film as a base.

The PET film was removed from the resin sheet to obtain a one-layer resin sheet. The thickness of the resulting one-layer resin sheet (before thermal curing) was 50 μm. The resulting resin sheet was interposed between rolled copper foils (trade name: BHY-22B-T, manufactured by Japan Energy Corporation) having a thickness of 18 μm such that the surfaces of the resin sheet were in contact with the roughened surfaces of the rolled copper foils. The resin sheet and the foils were thermally pressed for one hour at 200° C. and a pressure of 3 MPa to produce a copper foil laminate (including the one-layer resin sheet sandwiched between the rolled copper foils).

Using the resulting copper foil laminate having copper foil layers at both surfaces, resistance to soldering heat was evaluated.

The result thereof is shown in Table 5. Furthermore, the copper foils of the resulting copper foil laminate were removed by etching to obtain a cured sheet. The dielectric characteristics, glass transition temperature, and flame retardance of the resulting cured sheet were measured. The results thereof are shown in Table 5.

A resin composition was prepared as in Example 1 except that the soluble polyimide resin, the phosphazene compound, the cyanate ester compound, and the curing accelerator were mixed at a predetermined ratio shown in Table 1. Using the resulting resin composition, a resin sheet (before thermal curing) and a cured resin sheet were obtained using the same method and conditions as those in Example 1. The resistance to soldering heat, dielectric characteristics, glass transition temperature, and flame retardance of each of the resulting resin sheets were measured. The results thereof are shown in Table 5.

TABLE 4

|  | Example | | | | | | | Comparative Example | |
| --- | --- | --- | --- | --- | --- | --- | --- | --- | --- |
|  | 5 | 6 | 7 | 8 | 9 | 10 | 11 | 3 | 4 |
| Polyimide resin (PI) | | | | | | | | | |
| Amount used (g) | 50 | 50 | 30 | 50 | 50 | 50 | 50 | 50 | 50 |
| Cyanate ester compound (CY) | | | | | | | | | |
| Type | I | I | I | II | III | IV | I | I | I |
| Amount used (g) | 25 | 42 | 35 | 25 | 25 | 25 | 20 | 50 | 35 |
| Phosphazene compound (P) | | | | | | | | | |
| Amount used (g) | 25 | 8 | 35 | 25 | 25 | 25 | 50 | — | — |
| Other component: Curing catalyst | | | | | | | | | |
| Type | — | V | — | — | — | — | — | V | — |
| Amount used (g) | — | 0.01 | — | — | — | — | — | 0.01 | — |

TABLE 4-continued

| | Example | | | | | | | Comparative Example | |
|---|---|---|---|---|---|---|---|---|---|
| | 5 | 6 | 7 | 8 | 9 | 10 | 11 | 3 | 4 |
| TB-BPA | | | | | | | | | |
| Amount used (g) | | | | | | | | | 15 |
| Mixing ratio | | | | | | | | | |
| P/(PI + CY + P) | 0.25 | 0.08 | 0.35 | 0.25 | 0.25 | 0.25 | 0.42 | 0 | 0 |

I BADCY (trade name): 2,2'-bis(4-phenylcyanate)propane
II Methylcy (trade name): 4,4'-methylenebis(2,6-dimethylphenylcyanate)
III fluorocy (trade name): 2,2'-bis(4-phenylcyanate)-hexafluoropropane
IV PT-60 (trade name): oligo(3-methylen-1,5-phnylenecyanate)
(I to IV each manufactured by Lonza Inc.)
V Cu(AA): copper(II) acetylacetonate

TABLE 5

| | Example | | | | | | | Comparative Example | |
|---|---|---|---|---|---|---|---|---|---|
| | 5 | 6 | 7 | 8 | 9 | 10 | 11 | 3 | 4 |
| Dielectric constant/ dielectric loss tangent | | | | | | | | | |
| 3 GHz | 2.8/0.08 | 2.9/0.09 | 3.0/0.10 | 2.7/0.05 | 2.6/0.05 | 2.8/0.09 | 3.3/0.11 | 3.0/0.09 | 3.8/0.018 |
| 5 GHz | 2.9/0.07 | 2.8/0.09 | 3.1/0.11 | 2.8/0.06 | 2.7/0.06 | 2.9/0.09 | 3.1/0.14 | 2.8/0.09 | 3.7/0.018 |
| 10 GHz | 2.9/0.07 | 2.7/0.09 | 3.1/0.10 | 2.8/0.06 | 2.7/0.06 | 2.9/0.10 | 3.0/0.15 | 2.9/0.10 | 3.7/0.019 |
| Glass transition temperature (° C.) | 172 | 209 | 168 | 168 | 163 | 197 | 128 | 215 | 147 |
| Resistance to soldering heat | | | | | | | | | |
| 260(° C.)/min | PASS | PASS | PASS | PASS | PASS | PASS | Blistering occurred | PASS | Blistering occurred |
| Flame retardance (UL) | 94V-0 | 94V-0 | 94V-0 | 94V-0 | 94V-0 | 94V-0 | 94V-0 | Burned | 94V-0 |

[Advantages of the Invention]

As described above, a thermosetting resin composition of the present composition contains a polyimide resin, a phenol resin, and an epoxy resin as essential components, the epoxy resin and the phenol resin being mixed at a predetermined ratio with the polyimide resin. Furthermore, in the thermosetting resin composition of the present invention, the mixing ratio between the epoxy resin and the phenol resin is set at a predetermined value.

Therefore, it is possible to provide a thermosetting resin composition excellent in flowability required for embedding a circuit, adhesiveness to an adherend, such as a circuit board, processability and handleability enabling bonding at low temperatures, and heat resistance with respect to thermal expansion and thermal decomposition. Furthermore, it is possible to provide a thermosetting resin composition in which a cured resin obtained by curing the thermosetting resin composition has a much lower dielectric constant and a much lower dielectric loss tangent in the GHz range compared with a conventional resin composition including a polyimide resin and an epoxy resin, thus having excellent dielectric characteristics.

Consequently, compared with the conventional resin composition, bonding at a lower temperature is enabled, and superior processability, handleability, heat resistance, and dielectric characteristics are shown. Thus, it is possible to provide a thermosetting resin composition having various properties in a well-balanced manner, which is advantageous.

Furthermore, a thermosetting resin composition of the present invention contains a polyimide resin (A), a phosphazene compound (D), and a cyanate ester compound (E), and as the phosphazene compound (D), a phosphazene compound having a specific structure is used.

As a result, it is possible to sufficiently satisfy the requirements of both flame retardance and other physical properties, such as heat resistance, processability (including solvent solubility), and dielectric characteristics.

INDUSTRIAL APPLICABILITY

A thermosetting resin composition of the present composition contains a polyimide resin, a phenol resin, and an epoxy resin as essential components, the epoxy resin and the phenol resin being mixed at a predetermined ratio with the polyimide resin.

Furthermore, a thermosetting resin composition of the present invention contains a polyimide resin (A), a phosphazene compound (D), and a cyanate ester compound (E), and as the phosphazene compound (D), a phosphazene compound having a specific structure is used.

These thermosetting resin compositions can be suitably used for multilayer bodies, such as circuit boards, e.g., flexible printed circuit boards (FPCs) and build-up circuit boards, and as laminating materials constituting such multilayer bodies. In particular, the thermosetting resin compositions can be suitably used for manufacturing printed circuit boards that can sufficiently meet the requirement of improving information processing capability in electronic devices. Furthermore, for example, when the thermosetting resin composition of the present invention is formed into a varnish solution or the like, it is possible to produce a resin preparation useful as an adhesive, a coating material, an ink, or the like. Therefore, the present invention is applicable not only in various resin industries and the chemical industry which manufacture thermosetting resin compositions, but also in the resin processing industry which manufactures resin preparations, multilayer bodies, etc., the electronic part industry which manufactures circuit boards, etc., and the electronic device industry.

The invention claimed is:

1. A thermosetting resin composition comprising at least a polyimide resin component (A) containing at least one polyimide, a phenol resin component (B) containing at least one phenol resin, and an epoxy resin component (C) containing at least one epoxy resin, wherein the mixing ratio by weight (A)/[(B)+(C)] is in a range of 0.4 to 2.0, the mixing ration by weight of the phenol resin component (B) and the epoxy resin component (C), wherein the polyimide resin (A) is produced by reacting an acid dianhydride component contains at least an acid dianhydride represented by general formula (1):

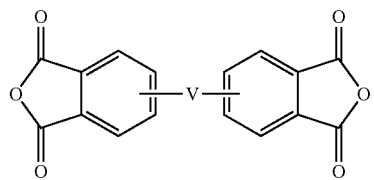

(1)

wherein V represents a direct bond, —O—, —O-T-O—, —(C=O)—, —C(CF3)2-, or —C(CH3)2-, T representing a divalent organic group.

2. The thermosetting resin composition according to claim 1, wherein the mixing ratio by mole (B)/(C) is in a range of 0.4 to 1.2, the mixing ratio by mole being the ratio of the number of moles of the hydroxyl group of the phenol resin contained in the phenol resin component (B) to the number of moles of the epoxy group of the epoxy resin contained in the epoxy resin component (C).

3. The thermosetting resin composition according to claim 1 or 2, wherein the polyimide resin (A) contains a soluble polyimide resin.

4. The thermosetting resin composition according to claim 3, wherein the polyimide resin (A) dissolves in an amount of 1% by weight or more in at least one organic solvent selected from the group consisting of dioxolane, dioxane, tetrahydrofuran, N,N-dimethylformamide, N,N-dimethylacetamide, and N-methyl-2-pyrrolidone in a temperature range of 15° C. to 100° C.

5. The thermosetting resin composition according to claim 4, wherein the polyimide resin (A) contains at least one component for imparting organic solvent solubility which is selected from the group consisting of an aliphatic compound component, an alicyclic compound component, and a bisphenol compound-alkylene oxide adduct component, so as to exhibit solubility in a mixed solvent containing a low-boiling organic solvent.

6. A thermosetting resin composition comprising at least a polyimide resin component (A) containing at least one polyimide resin, a phenol resin component (B) containing at least one phenol resin, and an epoxy resin component (C) containing at least one epoxy resin, wherein the mixing ratio by weight (A)/[(B)+(C)] is in a range of 0.4 to 2.0, the mixing ratio by weight being the ratio of the weight of the polyimide resin component (A) to the total weight of the phenol resin component (B) and the epoxy resin component (C), wherein the polyimide resin (A) is produced by reacting an acid dianhydride component with a diamine component or an isocyanate component, and the acid dianhydride component contains at least an acid dianhydride represented by general formula (1):

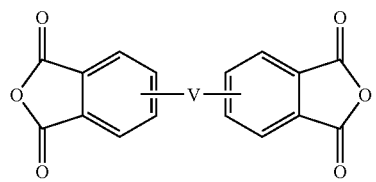

(1)

wherein V represents a direct bond, —O—, —O-T-O—, —(C=O)— —C(CF3)2-, or —C(CH3)2—, T representing a divalent organic group wherein the polyimide resin (A) is produced by reacting an acid dianhydride component with a diamine component or an isocyanate component, and the diamine component or the isocyanate component contains at least any one of a siloxane diamine, a diamine containing a hydroxyl group and/or a carboxyl group, a diamine having amino groups at the meta positions, a diamine having amino groups at the ortho positions, an isocyanate having an amino group at the meta position, and an isocyanate having an amino group at the ortho position.

7. A multilayer body comprising at least one resin layer formed of the thermosetting resin composition according to claim 1.

8. The multilayer body according to claim 7, wherein the multilayer body is used as a circuit board or a multilayer printed circuit board.

9. A circuit board comprising a layer having a dielectric constant of 3.3 or less and a dielectric loss tangent of 0.020 or less in a range of in a frequency range of 1 to 10 GHz and being formed on wiring boards or circuits, wherein the layer is obtained by curing a thermosetting resin composition comprising at least a polyimide resin component (A) containing at least one polyimide resin, a phenol resin component (B) containing at least one phenol resin, and an epoxy resin component (C) containing at least one epoxy resin, wherein the mixing ratio by weight (A)/[(B)+(C)] is in a range of 0.4 to 2.0, the mixing ratio by weight being the ratio of the weight of the polyimide resin component (A) to the total weight of the phenol resin component (B) and the epoxy resin component (C).

10. The thermosetting resin composition circuit board according to claim 9, wherein the mixing ratio by mole (B)/(C) is in a range of 0.4 to 1.2, the mixing ratio by mole being the ratio of the number of moles of the hydroxyl group of the phenol resin contained in the phenol resin component (B) to the number of moles of the epoxy group of the epoxy resin contained in the epoxy resin component (C).

11. The thermosetting resin composition circuit board according to claim 9 or 10, wherein the polyimide resin (A) contains a soluble polyimide resin.

12. The thermosetting resin composition according to claim 11, wherein the polyimide resin (A) dissolves in an amount of 1% by weight or more in at least one organic solvent selected from the group consisting of dioxolane, dioxane, tetrahydrofuran, N,N-dimethylformamide, N,N-dimethylacetamide, and N-methyl-2-pyrrolidone in a temperature range of 15° C. to 100° C.

13. The thermosetting resin composition circuit board according to claim 12, wherein the polyimide resin (A) contains at least one component for imparting organic solvent solubility which is selected from the group consisting of an aliphatic compound component, an alicyclic compound component, and a bisphenol compound-alkylene oxide adduct component, so as to exhibit solubility in a mixed solvent containing a low-boiling organic solvent.

14. The thermosetting resin composition circuit board according to claim 13, wherein the polyimide resin (A) is produced by reacting an acid dianhydride component with a diamine component or an isocyanate component, and the acid dianhydride component contains at least an acid dianhydride represented by general formula (1):

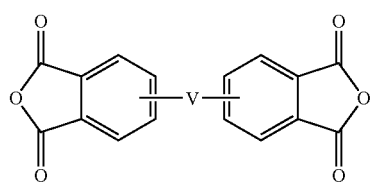
(1)

wherein V represents a direct bond, —O—, —O-T-O—, —O—CO-T-CO—O—, —(C=O)— —C(CF$_3$)$_2$—, or —C(CH$_3$)$_2$—, T representing a divalent organic group.

15. The circuit board according to claim 5, wherein the polyimide resin (A) is produced by reacting an acid dianhydride component with a diamine component or an isocyanate component, and the diamine component or the isocyanate component contains at least any one of a siloxane diamine, a diamine containing a hydroxyl group and/or a carboxyl group, a diamine having amino groups at the meta positions, a diamine having amino groups at the ortho positions, an isocyanate having an amino group at the meta position, and an isocyanate having an amino group at the ortho position.

16. A circuit board comprising a layer having a dielectric constant of 3.3 or less and a dielectric loss tangent of 0.020 or less in a range of in a frequency range of 1 to 10 GHz and being formed on wiring boards or circuits, wherein the layer is obtained by curing a thermosetting resin composition comprising at least a polyimide resin component (A) containing at least one polyimide resin, a phenol resin component (B) containing at least one phenol resin, and an epoxy resin component (C) containing at least one epoxy resin, wherein the mixing ratio by weight (A)/[(B)+(C)] is in a range of 0.4 to 2.0, the mixing ratio by weight being the ratio of the weight of the polyimide resin component (A) to the total weight of the phenol resin component (B) and the epoxy resin component (C), wherein the phenol resin component (B) contains at least one phenol resin selected from the group consisting of compounds having structures represented by the formulae:

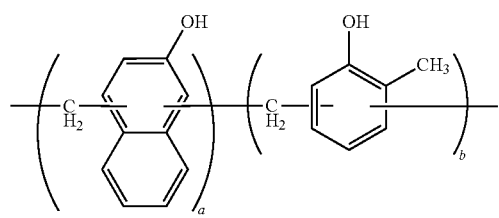

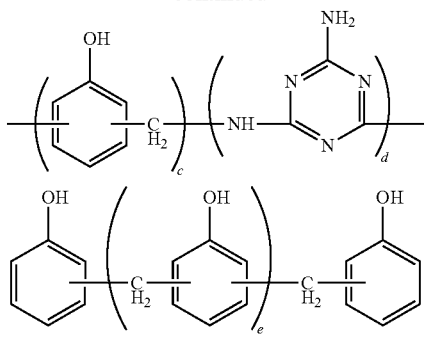

wherein a, b, c, d, and e each represent an integer of 1 to 10.

17. The circuit board according to claim 9, wherein the epoxy resin component (C) contains at least one epoxy resin selected from the group consisting of compound having structures represented by the formulae:

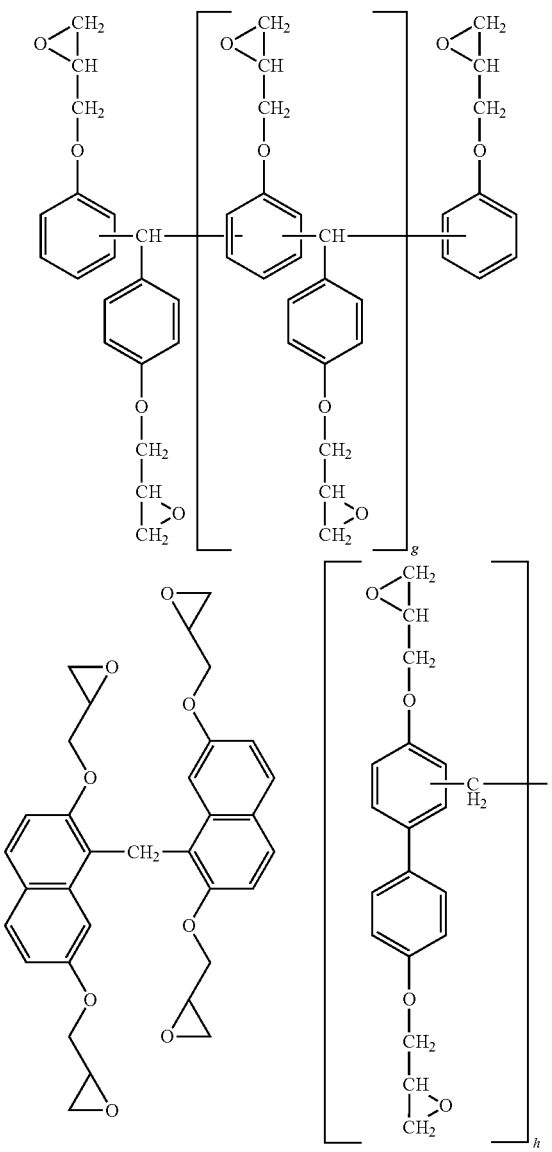

-continued
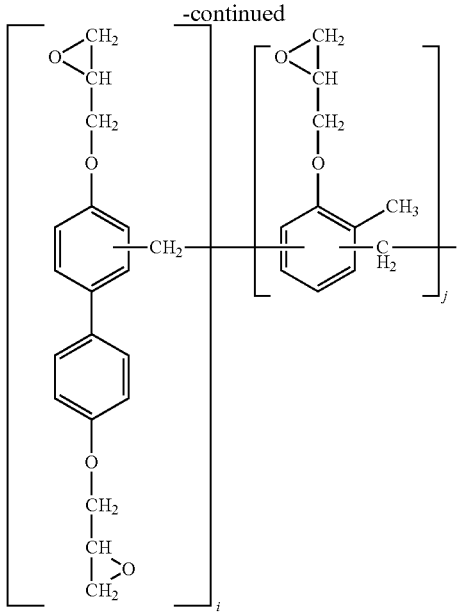
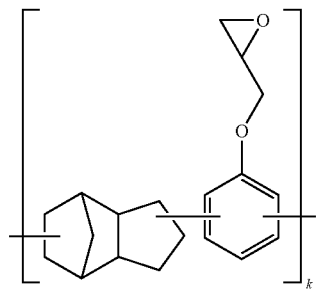
wherein g, h, i, j, and k each represent an integer of 1 to 10.
* * * * *